United States Patent
Choi

(10) Patent No.: US 12,512,341 B2
(45) Date of Patent: Dec. 30, 2025

(54) METHOD OF BONDING CHIPS AND A SYSTEM FOR PERFORMING THE METHOD

(71) Applicant: CANON KABUSHIKI KAISHA, Tokyo (JP)

(72) Inventor: Byung-Jin Choi, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 367 days.

(21) Appl. No.: 18/453,909

(22) Filed: Aug. 22, 2023

(65) Prior Publication Data

US 2025/0069918 A1    Feb. 27, 2025

(51) Int. Cl.
H01L 23/00 (2006.01)
H01L 21/67 (2006.01)
H01L 21/683 (2006.01)

(52) U.S. Cl.
CPC ........ *H01L 21/67144* (2013.01); *H01L 24/80* (2013.01); *H01L 24/97* (2013.01); *H01L 21/6838* (2013.01); *H01L 24/05* (2013.01); *H01L 2224/05571* (2013.01); *H01L 2224/05647* (2013.01); *H01L 2224/8001* (2013.01); *H01L 2224/80379* (2013.01); *H01L 2224/80896* (2013.01); *H01L 2224/97* (2013.01); *H01L 2924/05442* (2013.01)

(58) Field of Classification Search
CPC combination set(s) only.
See application file for complete search history.

(56) References Cited

U.S. PATENT DOCUMENTS 10,096,526 B2    10/2018   Mochizuki et al.
11,616,043 B2 *   3/2023   Chen ...................... H01L 24/16
                                                               257/737

* cited by examiner

*Primary Examiner* — David Vu
(74) *Attorney, Agent, or Firm* — Canon U.S.A., Inc. IP Division

(57) ABSTRACT

A method for bonding chips includes receiving chip placement information including positions on one or more product substrates where chips are to be bonded, generating instructions for a chip placement device to place a plurality of chips from one or more chip sources onto one or more intermediate substrates based on the received chip placement information, receiving the one or more intermediate substrates having the plurality of chips placed thereon according to the generated instructions, and actuating a plurality of bonding heads to collectively bond a subset of chips of the plurality chips of the one or more intermediate substrates to a product substrate of the one or more product substrates. A number of chips of the subset of chips is equal to a number of bonding heads of the plurality of the heads.

20 Claims, 22 Drawing Sheets

METHOD OF BONDING CHIPS AND A SYSTEM FOR PERFORMING THE METHOD

FIELD OF THE DISCLOSURE

The present disclosure relates to methods of bonding chips including collectively bonding multiple chips.

RELATED ART

Advanced packaging technologies demand precise and accurate control and placement of chips. For increased productivity/throughput, it is desirable in the art to collectively bond multiple source chips to multiple product chips using multiple bonding heads. However, known methods and systems are unable to bond multiple chips collectively while also selecting source chips that match the quality of the corresponding product chips. Even if pitches of the source chips and product chips are matched, thereby allowing collectively bonding using multiple bonding heads, the quality of the source chips that align with the multiple bonding heads will likely not match the quality of the corresponding product chips having the same alignment. Furthermore, in known systems, even when quality is not a factor (for example, if all of the source chips and all of the product chips have the same quality), when multiple bonding heads are being used, it is often not possible to utilize all of the multiple bonding heads because of the particular layout of the chips on the source substrate. Not being able to use all of the available bonding heads limits productivity/throughput.

FIG. 23 shows a schematic side view of a related art source substrate 1 and a related art product substrate 2, in which multiple bonding heads cannot be used to collectively bond source chips to product chips while matching the quality of the chips. As shown in FIG. 23, the substrate 1 has three different qualities of chips and the product substrate 2 has the same three different quality of chips. The first quality source chip 3, is designated "A," the second quality source chip 4 is designated "B," and the third quality source chip 5, is designated "C." Similarly, the first quality product chip 6, is designated "A," the second quality product chip 7 is designated "B," and the third quality product chip 8, is designated "C." FIG. 23 shows what occurs when four chips from the source substrate 1 have been collectively bonded using four bonding heads, even when it is possible to select source chips that match the pitches of the product chips. As shown in FIG. 23, it is possible to select four chips from the source substrate 1 and bond them to the product chips using four bonding heads at the same time. However, because the quality of the chips that are located at the proper pitches on the source substrate 1 do not match the quality of the corresponding chips on the product substrate 2, only two of the four source chips end up being bonded to a matching quality chip on the product substrate 2. That is, in known systems, in order to select a proper source chip that matches the quality of the product chip to which the source chip will be bonded, it becomes necessary to bond one chip at a time.

FIG. 24 shows a schematic top view of a related art source substrate where not all of the available bonding heads can be used during a collective bonding method due to the layout of the source chips 10 on the source substrate 12 not matching the layout of the transfer heads/bonding heads. FIG. 24 schematically shows two moments in time where a set of transfer heads 14 is attempting to pick up the maximum number of possible chips to bring to the bonding heads. In this illustrated example, the arrangement of transfer heads is 2×4. The arrangement of the transfer heads 14 is the same as the layout of the multiple bonding heads, i.e., in this example the arrangement the bonding heads would also be arranged 2×4. This is because each transfer head transfers one source chip to a corresponding one of the bonding heads. The left side of FIG. 24 shows a first moment when the transfer heads 14 have picked up three chips that align with the transfer heads. Then, the right side of FIG. 24 shows the next moment after the transfer heads have picked up four more chips. As shown in FIG. 24, due to the mismatched layout between the chips 10 on the source substrate 12 and the layout of the transfer heads, one transfer head of the eight cannot be used. This means one of the bonding heads will also not have a chip during the subsequent bonding step. Accordingly, productivity/throughput is reduced.

Thus, there is a need in the art for a method and system for collectively bonding multiple source chips to multiple product chips while also matching chip quality and/or improving productivity/throughput.

SUMMARY

A method for bonding chips includes receiving chip placement information including positions on one or more product substrates where chips are to be bonded, generating instructions for a chip placement device to place a plurality of chips from one or more chip sources onto one or more intermediate substrates based on the received chip placement information, receiving the one or more intermediate substrates having the plurality of chips placed thereon according to the generated instructions, and actuating a plurality of bonding heads to collectively bond a subset of chips of the plurality chips of the one or more intermediate substrates to a product substrate of the one or more product substrates. A number of chips of the subset of chips is equal to a number of bonding heads of the plurality of the heads.

A system for bonding chips includes one or more product substrate chucks configured to hold one or more product substrates, one or more intermediate substrate chucks configured to hold one more intermediate substrates, a plurality of bonding heads, one or more processors, and one or more memories storing instructions, when executed by the one or more processors, causing the system to: receive chip placement information including positions on the one or more product substrates where chips are to be bonded, generate instructions for a chip placement device to place a plurality of chips from one or more chip sources onto the one or more intermediate substrates based on the received chip placement information, receive the one or more intermediate substrates having the plurality of chips placed thereon according to the generated instructions, wherein the one more intermediate substrates is held by the one or more intermediate substrate chucks, and actuate the plurality of bonding heads to collectively bond a subset of chips of the plurality chips of the one or more intermediate substrates to a product substrate of the one or more product substrates, wherein the product substrate is held by the one or more product substrate chucks. A number of chips of the subset of chips is equal to a number of bonding heads of the plurality of the heads.

A method of manufacturing a plurality of articles includes receiving chip placement information including positions on one or more product substrates where chips are to be bonded, generating instructions for a chip placement device to place a plurality of chips from one or more chip sources onto one or more intermediate substrates based on the received chip placement information, receiving the one or more intermediate substrates having the plurality of chips placed thereon according to the generated instructions, actuating a plurality of bonding heads to collectively bond a subset of chips of the plurality chips of the one or more intermediate substrates to a product substrate of the one or more product substrates, wherein a number of chips of the subset of chips is equal to a number of bonding heads of the plurality of the heads, and singulating the product substrate to make the plurality of articles.

In an embodiment, the apparatus can further include a substrate receiver and a substrate transfer tool configured for transferring a first chip structure of the first sandwich structure to the substrate receiver.

BRIEF DESCRIPTION OF THE DRAWINGS

Implementations are illustrated by way of example and are not limited in the accompanying figures.

Skilled artisans appreciate that elements in the figures are illustrated for simplicity and clarity and have not necessarily been drawn to scale. For example, the dimensions of some of the elements in the figures can be exaggerated relative to other elements to help improve understanding of implementations of the invention.

DETAILED DESCRIPTION

The following description in combination with the figures is provided to assist in understanding the teachings disclosed herein. The following discussion will focus on specific implementations and implementations of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and can be found in textbooks and other sources within the arts.

Figure 1:
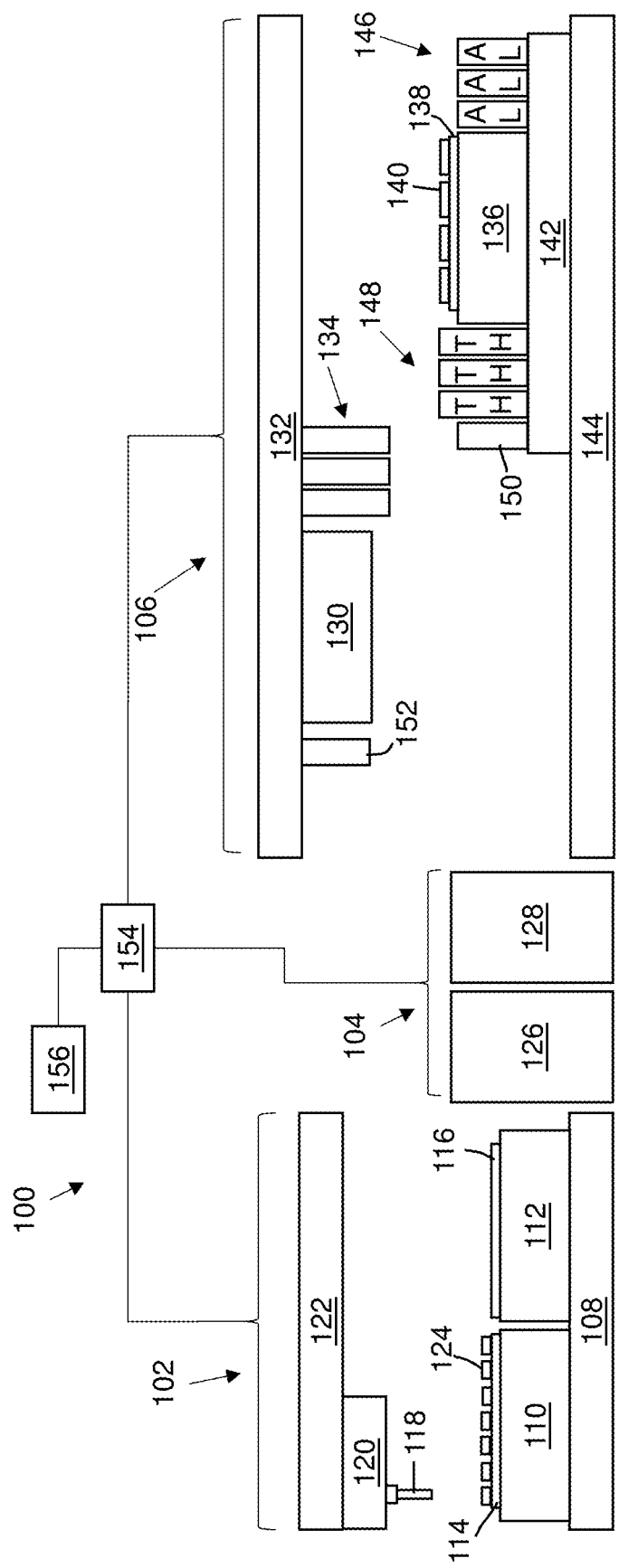
FIG. 1 shows a schematic side view of a bonding system in accordance with an example embodiment.

FIG. 1 shows a schematic side view of a bonding system 100 in accordance with an example embodiment. As shown in FIG. 1, the bonding apparatus 100 includes a chip arranging section 102, a chip transfer and activation section 104, and a chip bonding section 106. The chip arranging section 102 is the portion of the overall bonding system 100 that arranges chips prior to the bonding. As used herein, chip means an integrated circuit, also referred to as a microchip, a computer chip, etc. A chip may be defined as a small block of semiconducting material on which a given functional circuit is fabricated. In the context of a wafer/substrate that has been divided into individual chips, the chip is known is a die. The chip will typically carry a set of integrated electronic components and circuits formed on it by patterning, coating, etching, doping, plating, singulating, etc. The chip will typically have electrical functions such as: memory, logic, field programmable gate arrays (FPGA), accelerator circuits, application-specific integrated circuits (ASICs), security co-processors, graphics processing units (GPUs), machine learning circuits, specialized processors, controllers, devices, electrical circuits, arrays of passive components, etc. The chip may also be a MEMS device, an optical device, an electrical-optical device, etc. The chip transfer and activation section 104 is the portion of the overall bonding system 100 that transfers the arranged chips from the chip arranging section 102 to the chip bonding section 106. In another configuration, the chip arranging section can be a separate apparatus. Similarly, the chip activation section can be a separate apparatus. The chip transfer and activation section 104 also activates the arranged chips so the arranged chips are ready for bonding. In an alternative embodiment, the activation section 104 activates the plurality of chips 124 prior to the chips being arranged on the intermediate substrate 116. The chip bonding section 106 receives chips that have been arranged and activated and then performs the bonding. The details of each of these sections are discussed in detail below.

The chip arranging section 102 includes a base 108 for supporting a first substrate chuck 110 and a second substrate chuck 112. The first substrate chuck 110 holds a first substrate 114 and the second substrate chuck 112 holds a second substrate 116. The first substrate 114 is also referred herein as a source substrate and the second substrate 116 is also referred herein as an intermediate substrate. The first substrate chuck 110 is also referred herein as a source substrate chuck. The second substrate chuck is also referred herein as a first intermediate substrate chuck or the intermediate substrate chuck of the chip arranging section. The chip arranging station 102 further includes chip placement device 118. The chip placement device 118 is also known in the art as a pick-and-place machine or a chip shooter. The chip placement device 118 has the ability to quickly pick up chips from a first source and place them in a predetermined arrangement at a difference location. The placement accuracy may be relatively low as compared to the accuracy discussed below with respect to the chip bonding section 106. For example, the chip placement device 118 may place chips within 5 μm to 20 μm of a target position. The chip placement device 118 may be coupled with a carriage 120 that can travel along a bridge 122. In operation, upon receiving instructions, the chip placement device 118 will pick up a chip located on the source substrate 114 and move along the bridge 122 via the carriage 120 to place the chip on the intermediate substrate 116. The moment shown in FIG. 1 is prior to any chips having been arranged by the chip placement device 118. Thus, a plurality of chips 124 are shown in the source substrate 114 and no chips are shown on the intermediate substrate 116. The chip placement device may by any suitable device known in the art, for example die sorters (for example a BESTEM-S300) from Canon Machinery Inc. of Kusatsu-shi, Shiga-ken, Japan. While one source substrate 114 and one intermediate substrate is illustrated in the example embodiment, multiple source substrates and multiple intermediate substrates may be used. In that case, the chip placement device 118 would pickup up chips from the multiple different source substrates in order to prepare the multiple intermediate substrates. Thus, there may be one or more source substrates and one or more intermediate substrates. Each substrate may be a wafer, e.g., a silicon wafer.

The chip transfer and activation section 104 includes a transfer robot 126 that is able to lift and carry the intermediate substrate 116 from the intermediate substrate chuck 112 and bring it to a different intermediate substrate chuck in the bonding section 106. As understood in the art, the transfer robot 126 generally includes a hand and a robot arm that provides the degrees of motion to lift, carry, and place a substrate from one location to another, such as from one substrate chuck to another or from a substrate storage location to a substrate chuck. The transfer robot 126 may be any suitable device known in the art, for example robots such as the wafer handling robot RR756L15 provided by Rorze Corporation of Fukuyama-shi, Hiroshima-ken, Japan. The chip transfer and activation device 104 further includes an activation device 128. The activation device 128 is a device that prepares the chips being transferred for hybrid bonding. Hybrid bonding is a chip bonding technique in which electrically insulating (Silicon Dioxide) chip surfaces with recessed metallic (e.g. Copper) pads are brought into contact with each other. The metallic pads are aligned with each other, while the electrically insulating surfaces are bonded to each other via direct contact. Heat is then applied to the bonded structure which causes the metallic pads to expand more relative to the electrically insulating material and contact each other, thus forming electrical connections between the chips. In an example embodiment, the activation device 128 may include a fluid source that applies for example deionized water and possibly a plasma source that activates the surface of the chips prior to them being carried by the transfer robot 126. Due to the materials of the chips (i.e., dielectric), when the activated chip is brought into contact with another chip a fusion bond will occur between the dielectric surfaces of the two chips.

The bonding section 106 includes a third substrate chuck 130 for receiving the intermediate substrate 116 that has been carried by the transfer robot 126 and has chips that have been activated by the activation device 128. The third substrate chuck is also referred herein as a second intermediate substrate chuck or the intermediate substrate chuck of the bonding section. The bonding section 106 may include a bridge 132 to which the second intermediate substrate chuck 130 is attached. The bridge 132 is also referred herein as the second bridge or the bridge of the bonding section. The bonding section 106 also includes a plurality of bonding heads 134 attached to the bridge 132. In an embodiment, the bonding heads 134 may include a perimeter chuck region that holds the back surface of the chip 124 along the perimeter. In an embodiment, the bonding heads 134 may include a chucking portion that holds a chip 124. In an embodiment, the bonding heads 134 may include one or more actuators that move chip chuck at least towards the product substrate chuck 136 and may move the chip chuck in all 6 directions (x, y, z, tip, tilt, and rotation). The actuators may be voice coil motors, piezoelectric motors, linear motors, nut and screw motors, piezo-actuated stages, brushless DC motor stages, DC motor stages stepper motors, which are configured to move the chip chuck to and from the product substrate chuck 136 and also applied a controlled force to the chip when it is in contact with the bonding surface 140. The chip chuck may hold the chip to the chucking surface using: a Bernoulli chuck, vacuum; electrostatic forces; electromagnetic forces; mechanical gripping forces; or any other method of releasably holding the chip to the chucking surface of the bonding head 134. The bonding section 106 further includes a product substrate chuck 136 holding a product substrate 138. The product substrate 138 has a plurality of chips 140 on the surface. The plurality of chips 140 on the product substrate 138 is where the chips from the intermediate substrate 116 will eventually be bonded, as discussed below. As shown in FIG. 1, the product substrate chuck 136 is carried by a carriage 142. The carriage 142 is moveable along a base 144.

The bonding section 106 may further include a plurality of alignment devices 146 and a plurality of transfer heads 148, all of which are also carried by the carriage 142. Each of the plurality of transfer heads 148, may include any one of a variety of methods of holding the chips including but not limited to: a Bernoulli chuck; a suction nozzle; an electrostatic chuck; an edge gripping chuck; a latching mechanism; or any method of releasably holding a chip. Each of the plurality of transfer heads 148, may include an actuator for moving in at least the z direction towards and away from the bridge 132. The plurality of alignment devices 146 are used to examine the alignment of chips on the plurality of bonding heads 134 after the chips have been transferred to the plurality of bonding heads 134 as discussed below. Each alignment device may be a microscope, a camera, an interferometer, or any sort of measuring device that is capable of measuring the position each chip on a nanometer scale. The information provided by the plurality of alignment devices 146 will allow the operator to know whether each chip is at a target position within an acceptable amount of error. The plurality of alignment devices 146 may be any suitable device known in the art, for example 20× microscope with 5 megapixel camera such as a CI-5MGMCL from Canon Inc., of Tokyo Japan. The plurality of transfer heads 148 are used to transfer the chips from the intermediate substrate 116 that is held by the second intermediate substrate 130 to the plurality of bonding heads 134.

The number of bonding heads of the plurality of bonding heads is at least two, but can be as many as 8 or 16. As shown more clearly below, the arrangement of the plurality of bonding heads may be in the form of columns and rows such as one by two, two by one, two by two, one by three, three by one, two by three, three by two, three by three, four by one, one by four, four by two, two by four, three by four, four by three, etc. In other words, the number of bonding heads may be represented as "m×n" where m is from 1 to 4 and n is from 1 to 4. If either of m or n is 1 than the other is at least 2 so that there are at least two bonding heads. In the example shown in FIG. 1, at least one of m or n is 3. The number and arrangement of transfer heads of the plurality of transfer heads may be the same as the number and arrangement of the bonding heads. Or, the number and arrangement of transfer heads of the plurality of transfer heads can be larger than those of the bonding heads.

The bonding section 106 may further include a first microscope 150 on the carriage 142 and a second microscope 152 on the bridge 132. The first microscope 150, being on the carriage 142, is moveable along the base 144 with the plurality of transfer heads 148, the product substrate chuck 136 and the plurality of alignment devices 146. The first microscope 150 is aimed upwardly in a direction toward the second intermediate substrate chuck 130. The first microscope 150 functions to measure positions of the plurality of chips on the intermediate substrate 116. The second microscope 152 faces downward in a direction toward the product substrate chuck. The second microscope 152 functions to measure positions of the chips on the product substrate 138. Each of the first and second microscopes may be suitable device known in the art, for example 20× microscope with a 5 megapixel camera such as a CI-5MGMCL from Canon Inc., of Tokyo Japan.

The bonding system 100 may be regulated, controlled, and/or directed by one or more processors 154 (controller) in communication with one or more components and/or subsystems such as the chip arranging section 102, the chip transfer and activation section 104, the bonding section 106, the chip placement device 118, the carriage 120, the source substrate chuck 110, first intermediate substrate chuck 112, the transfer robot 126, the activation device 128, the second intermediate substrate chuck 130, the plurality of bonding heads 134, the product substrate chuck 136, the carriage 142, the plurality of alignment devices 146, the plurality of transfer heads 148, the first microscope 150, and the second microscope 152. The processor 154 may operate based on instructions in a computer readable program stored in a non-transitory computer memory 156. The processor 154 may be or include one or more of a CPU, MPU, GPU, ASIC, FPGA, DSP, and a general-purpose computer. The processor 154 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device. All of the steps described herein may be executed by the processor 154.

Figure 2:
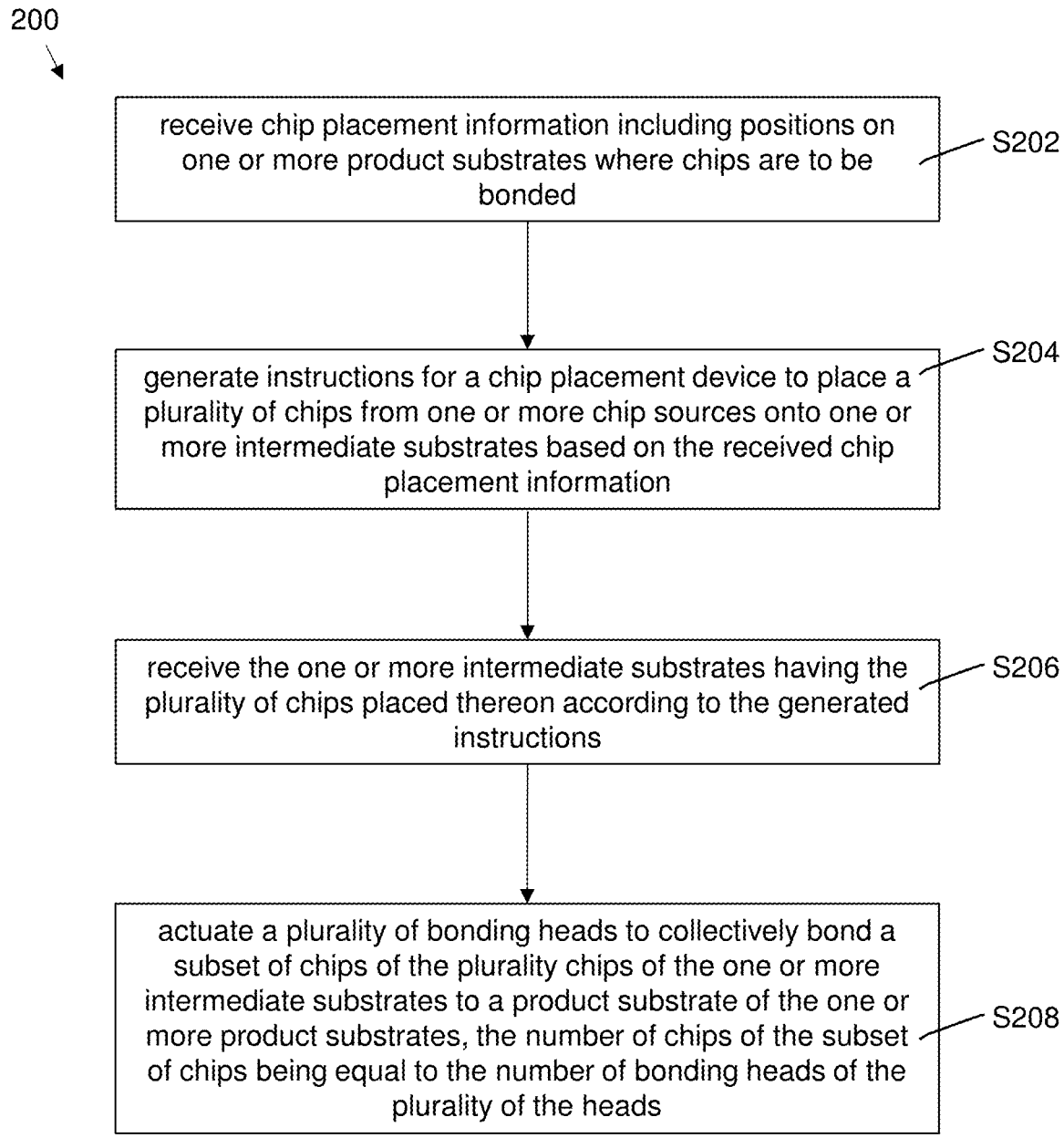
FIG. 2 shows a flowchart of a method for bonding chips using the bonding system of FIG. 1 in accordance with an example embodiment.
Figure 3A:
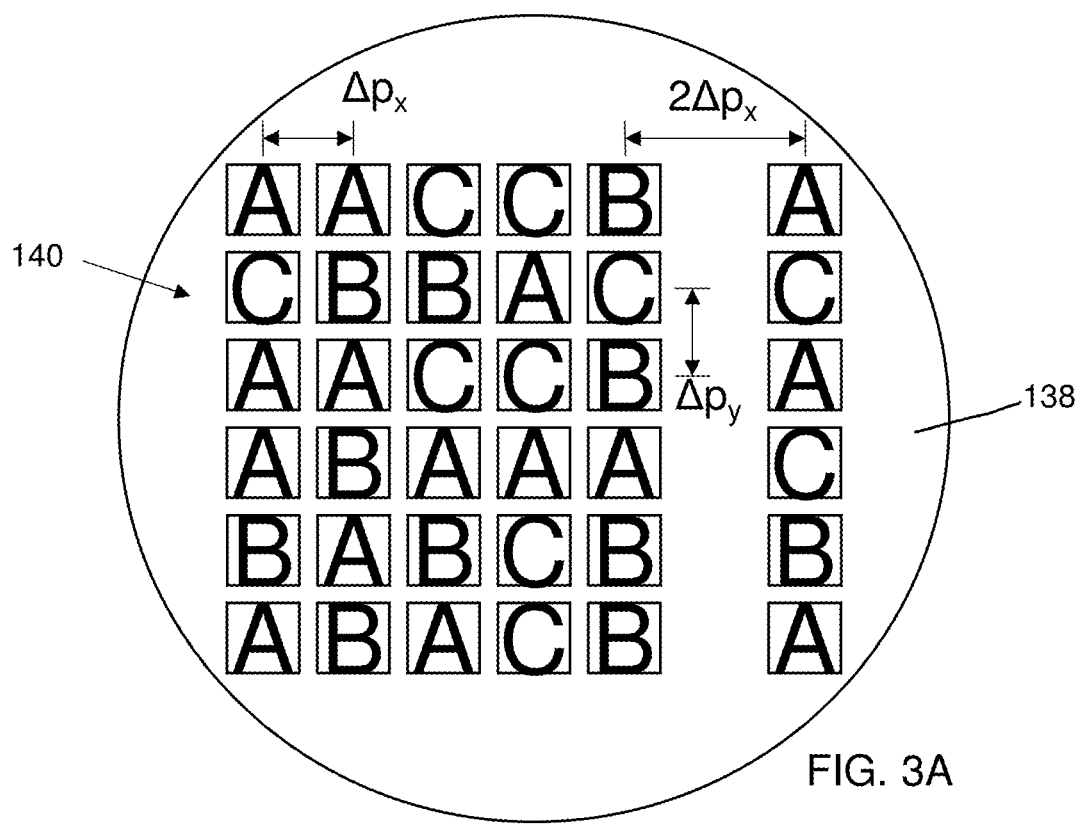
FIG. 3A shows a schematic top view of an example product substrate with a plurality of chips thereon in accordance with an example embodiment.

FIG. 2 shows a flowchart of a method for bonding chips 200 using the bonding system 100. The method 200 may begin with step S202 where chip placement information is received, the chip placement information including positions on one or more product substrates where chips are to be bonded. FIG. 3A shows a schematic top view of an example product substrate 138 with a plurality of chips 140 thereon. As shown in FIG. 3A, the plurality of chips 140 have different letter designations, A, B, or C. Each letter represents the quality of chip, where A represents a first quality, B represents a distinct second quality, and C represents a distinct third quality. While only three different quality chips are shown in the example product substrates 138, there can be a smaller number or larger number of different qualities on a single product substrate in other embodiments. The quality of the chips can be defined as maximum clock rate, percentages of functioning transistors at one or more specified clock rates, local cache size, thermal conductivity, and other properties which affect the performance of the chips which can vary depending on the fabrication performance of the chip. As also shown in FIG. 3A, each chip of the plurality of chips 140 is spaced apart from a neighboring chip in the X and Y dimensions. The distance between chips is referred herein as the pitch, where the distance between neighboring chips in the X dimension being the x-dimension pitch $\Delta p_x$ and the distance between neighboring chips in the Y dimension being the y-dimension pitch $\Delta p_y$. Both pitches are defined herein as the distance between the center point of one chip and the center point of the neighboring chip. However, any reference point on the chip is suitable to define the pitch as long as the same point is used for every chip. In the example product substrate 138 shown in FIG. 3A, there is a constant y-dimension pitch $\Delta p_y$ (i.e., every neighboring chip in Y dimension is equidistant), but there are two different x-dimension pitches. That is, as shown in FIG. 3A, many of the neighboring chips have a pitch of pitch $\Delta p_x$ while some have a pitch that is two times larger (i.e., $2\Delta p_x$). While these pitches are illustrated for purposes of providing an example, a variety of pitches may be present in both the X and Y dimensions in other embodiments. The information that is received in step S202 includes the position of the chips, the quality of the chips, and the pitches of the chips. For example, the position of the chips may be in terms of x/y coordinates on the substrate relative to a reference point (e.g., the center of the substrate), the quality of the chips may be a ranking identifier (e.g., A, B, C), and the pitches may be distance values (e.g., nanometers in x and y). Furthermore, there can be multiple product substrates. That is, the information gathered in step S202 may be regarding a plurality of product substrates.

Figure 3B:
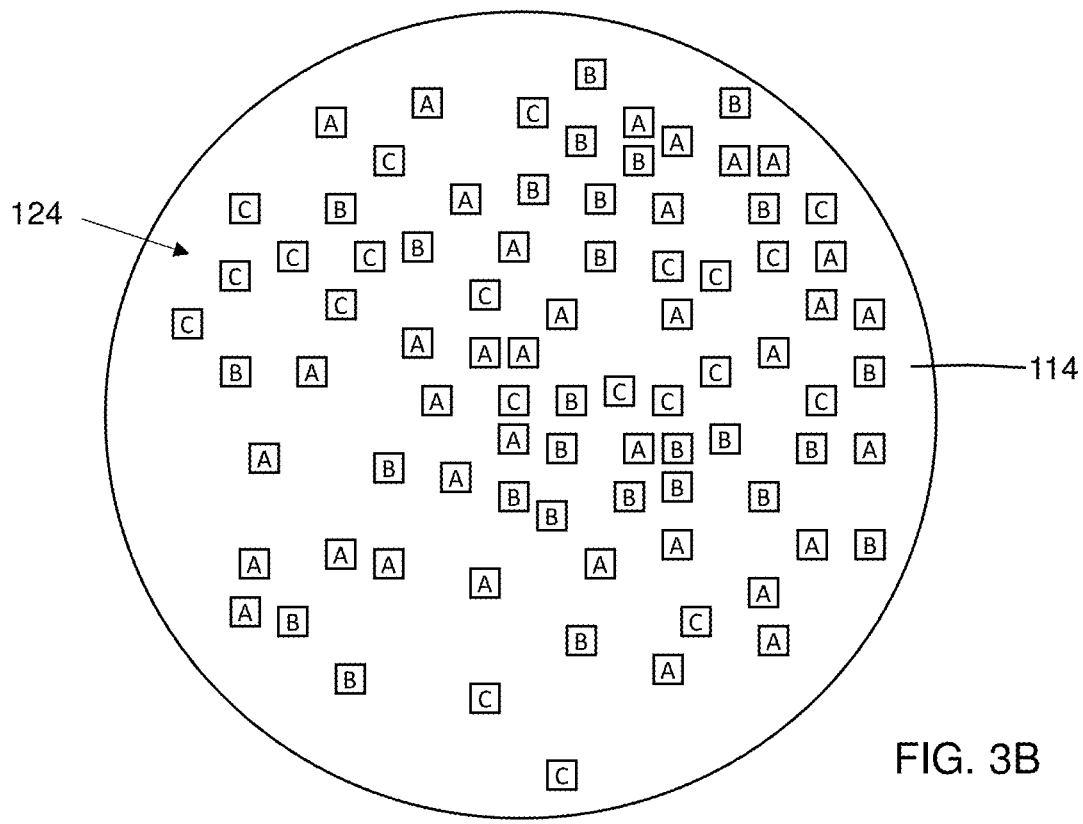
FIG. 3B shows a schematic top view of an example source substrate with a plurality of chips thereon in accordance with an example embodiment.

FIG. 3B shows a schematic top view of an example source substrate 114. As shown in FIG. 3B, the source substrate 114 has a plurality of chips 124 thereon. The plurality of chips 124 of the source substrate 114 can have any arrangement and variety of chips for use in the method 200. That is, as shown in FIG. 3B, the plurality of chips 124 have various qualities A to C and are randomly distributed without any set pitches. In an embodiment, the plurality of chips 124 on the source substrate 114 are distributed at a certain pitch (i.e., have a source pitch), but the source pitch has no relationship with a product pitch of the plurality of chips 140 on the product substrate 138. While only quality A to C are shown in FIG. 3A for purposes of simplicity because the example product substrate 138 only has quality A to C, the source substrate 114 can have additional qualities. This is because, as discussed below in subsequent steps, only the chips that are needed are taken from the source substrate 114. For the same reason, the pitches of the plurality of chips 124 on the source substrate 114 can be random because the chips are going to repositioned in the subsequent steps. As noted above, while one source substrate 114 is illustrated, there can be many source substrates (i.e., one or more). As also shown in FIG. 3A, in the example embodiment the plurality of chips 124 are much smaller than the plurality of chips 140 on the product substrate 138. However, in other example embodiments, the sizes of the chips may vary or may be closer in size to the plurality of chips 140 on the product substrate 138.

At the moment in which step S202 is performed, the bonding system 100 is in the state shown in FIG. 1. That is, at this moment, the source substrate 114 with the plurality of chips 124 is held by the source substrate chuck 110 and the product substrate 138 with the plurality of chips 140 is held by the product substrate chuck 136. Prior to this moment, the robot arm 126 has placed the source substrate 110 onto the source substrate chuck 110 and also placed the product substrate 138 onto the product substrate chuck 136.

The method 200 may then proceed step S204 where instructions are generated for the chip placement device 118 to place a plurality of chips from one or more chip sources onto one or more intermediate substrates based on the received chip placement information. In this step the information received in step S202 (i.e., the information regarding position of the chips, quality of chips, and pitches) is used to determine what particular quality of chips are needed for bonding and what positions on the intermediate substrate 116 would allow for a more efficient bonding process. Regarding the quality of the chips that are needed, as noted above, the A, B, C designation in the example product substrate 138 informs what quality is needed. That is, for each "A" chip on the product substrate 138 a corresponding "A" chip is needed for bonding. Similarly, for each "B" chip on the product substrate 138 a "B" chip is needed, and for each "C" chip on the product substrate 138 a "C" chip is needed. Thus, the instructions generated in step S204 include how many of each quality of chip is needed for the bonding process. Regarding the placement of the chips on the intermediate substrate, the pitch information received in step S202 to generate the instructions of where to place the chips. In particular, the chips from the source substrate 114, which as noted above may be randomly distributed and/or have pitches that do not match the pitches of the chips on the product substrate 138, can be placed onto the intermediate substrate 116 in such a manner that the pitches of the chips of the intermediate substrate 116 matches the pitches of the plurality of chips 140 on the product substrate 138 or are placed at integer multiples of the pitches of the plurality of chips 140 on the product substrate 138. As will become clear below in the subsequent steps, when the quality information and the pitch information received in step S202 is used to generate instructions to place the chips onto the intermediate substrate 116 in a manner that the quality and pitches match the plurality of chips 140 the product substrate 138, it is possible to using the plurality of bonding heads 134 to collectively bond multiple chips to the plurality of chips 140 on the product substrate 138.

Figure 4:
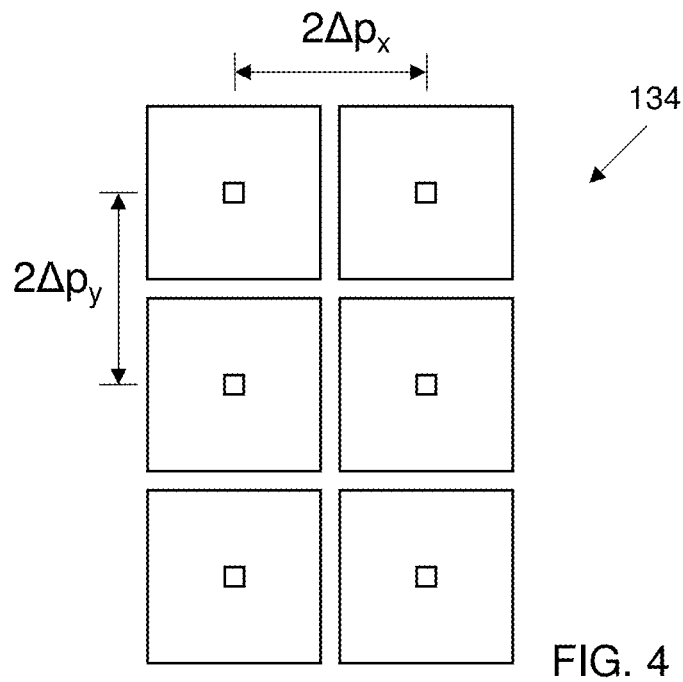
FIG. 4 shows a schematic bottom view of a plurality of bonding heads in accordance with an example embodiment.

In addition to accounting for quality of the chips and pitches of the chips, the instructions generated in step S202 may also be based on information regarding the pitches of the plurality of bonding heads 134, which themselves are set based on the pitch of the plurality of chips 140 of the product substrate 138. FIG. 4 shows a schematic bottom view of a plurality of bonding heads 134 in which there are two by three bonding heads for a total of 6 (i.e., where m is 2 and n is 3). Due to structural limitations, the plurality of bonding heads 134 cannot have a pitch that is exactly equal to the pitches of the plurality of chips 140 on the product substrate 138. That is, the chips themselves can be in the pitch of 3 mm to 32 mm. However, the pitches of the bonding heads are limited by their geometric dimensions of 30 mm to 150 mm each other. Thus, in an example embodiment the bonding heads may be first positioned to have a pitch that is an integer multiple of the pitches of the plurality of chips 140 on the product substrate 138. For example, in the illustrated embodiment, as noted above, the pitches of the plurality of chips 140 on the product substrate 138 in the X dimension are as small as $\Delta p_x$ and as small as $\Delta p_y$ is the Y dimension. Because the plurality of bonding heads 134 cannot be set this small, they are instead set to an integer multiple of two times the x and y pitches in the embodiment illustrated in FIG. 4. As shown in FIG. 4, in the example embodiment, the plurality of bonding heads 134 have been set to have a pitch of $2\Delta p_x$ in the X dimension and $2\Delta p_y$ in the Y dimension. As with the chips, the pitches of the bonding heads are defined herein as the distance between the center point of one bonding head to the neighboring bonding head in the X and Y dimensions. However, any reference point can be used to define the bonding head pitch as long as it is a consistent reference point. While an integer multiple of two is used in the example embodiment, other integer multiples are also suitable. Furthermore, while the integer multiple is the same for both X and Y dimensions in the example embodiment (i.e., 2), in other embodiments, the integer multiple can be different, i.e., $2\Delta p_x$ and $3\Delta p_x$ depending on the particular application.

Figure 5:
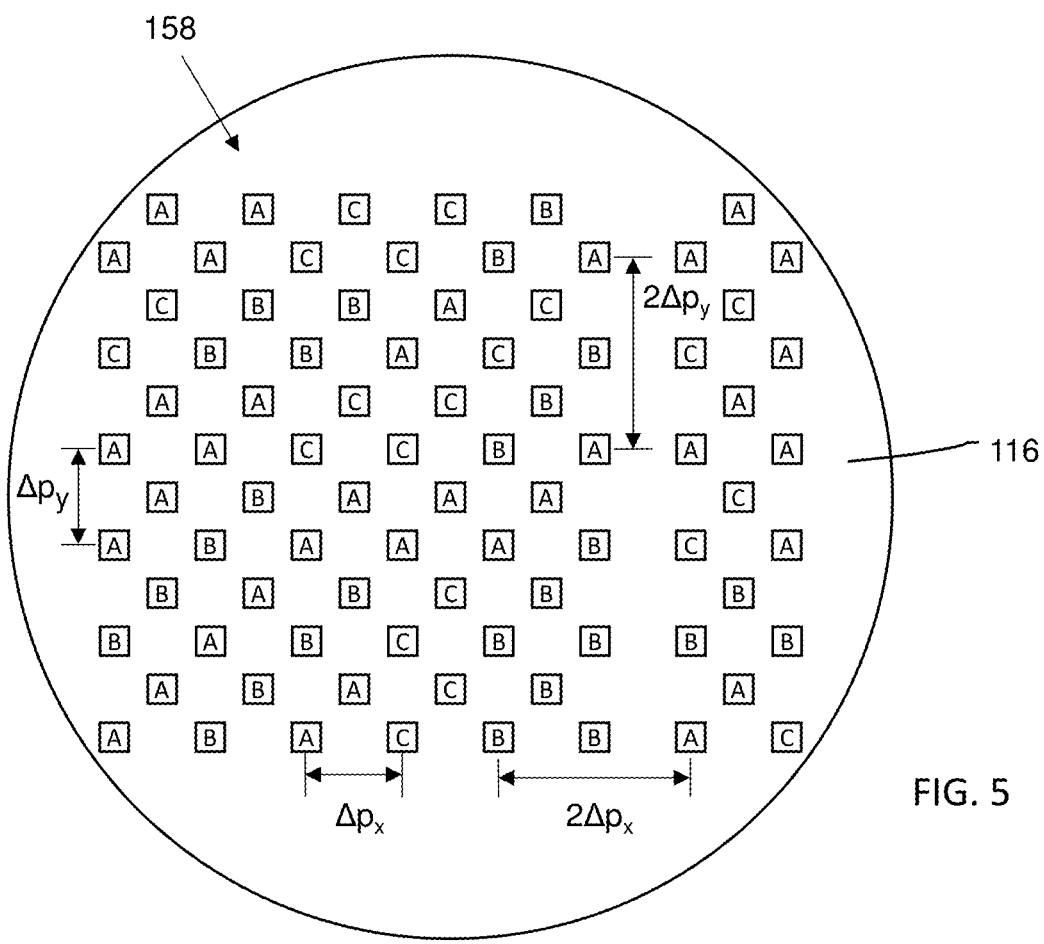
FIG. 5 shows a schematic top view of an intermediate substrate after a plurality of chips have been placed by a chip placement device in accordance with an example embodiment.
Figure 6A:
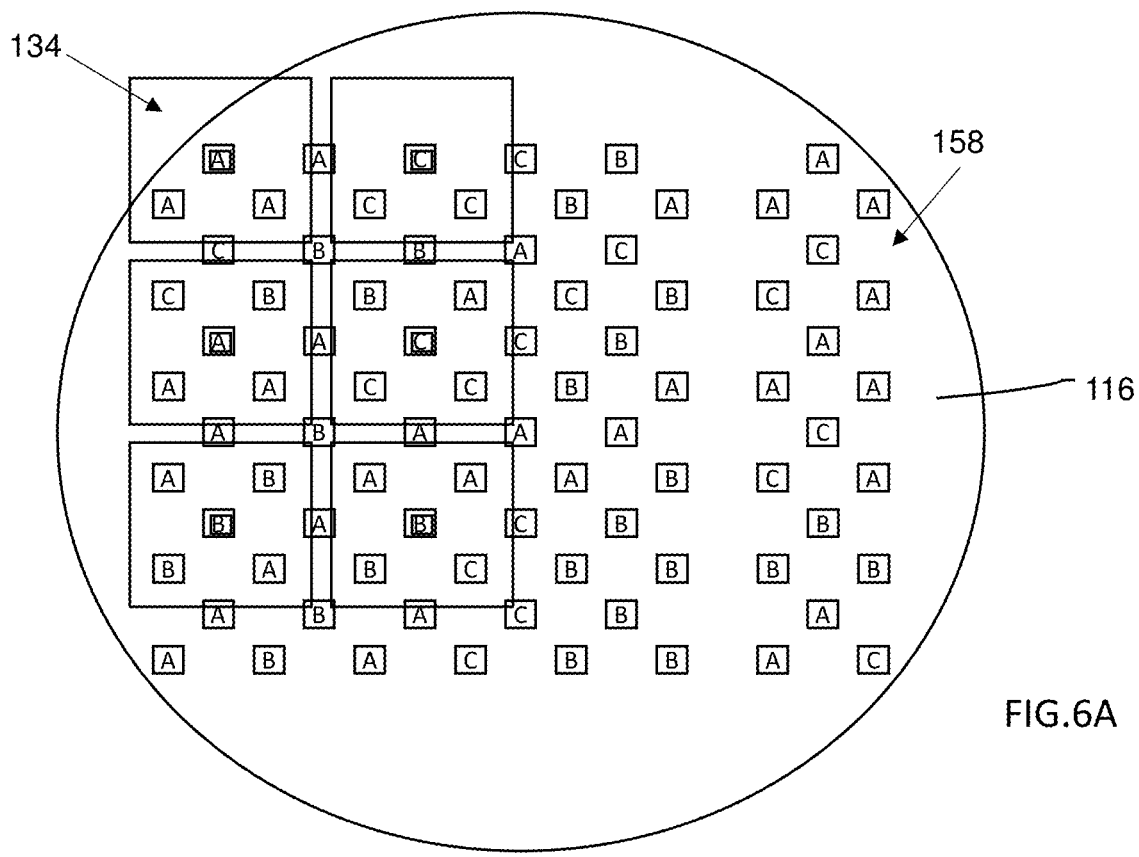
FIG. 6A shows the plurality of bonding heads schematically projected onto a first subset of chips on the intermediate substrate in accordance with an example embodiment.
Figure 6B:
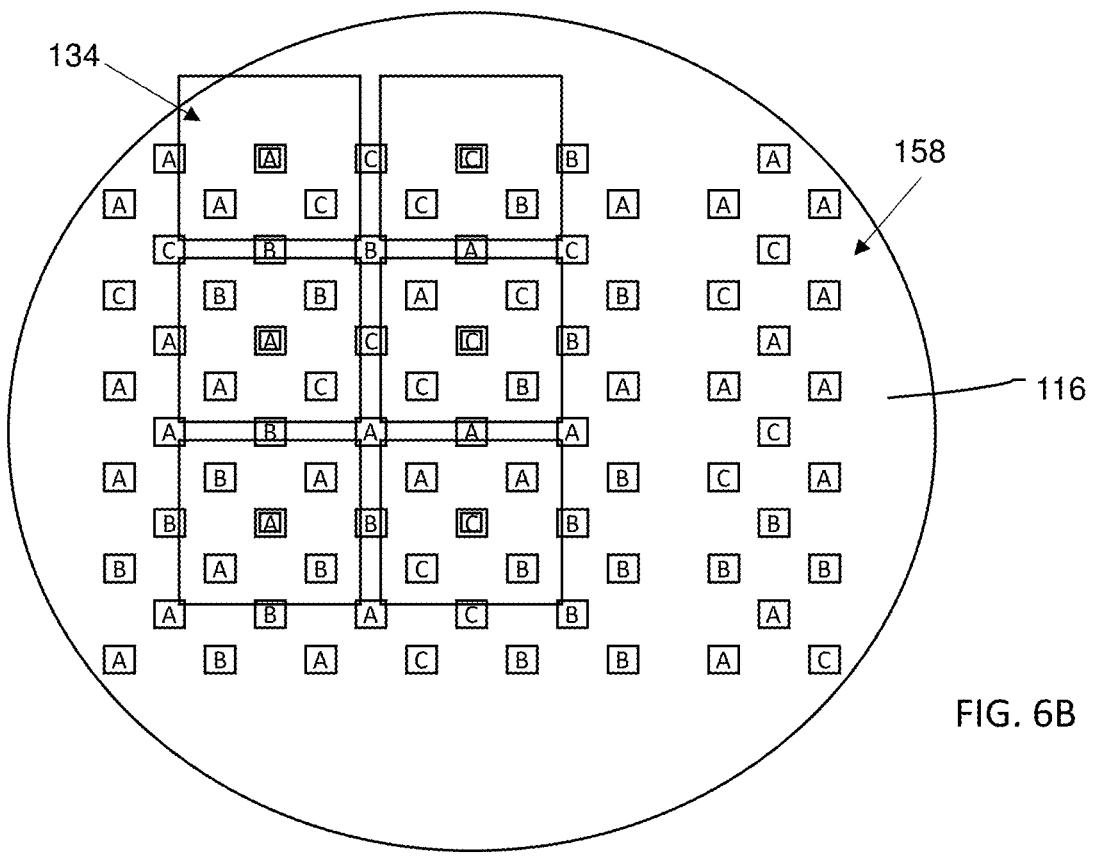
FIG. 6B shows another projection of the plurality of bonding heads onto a second subset of chips of the intermediate substrate in accordance with an example embodiment.

Once the pitches of the plurality of bonding heads 134 have been determined and set based on the pitches of the plurality of chips 140 for the product substrate 138, the bonding head pitch information may be used in step S202 to generate the instructions. Specifically, in addition determining which quality of chips are needed, the placement of the chips that will align with the pitches of the bonding heads is determined. Then, the plurality of the chips 124 from the source substrate 114 can be placed on the intermediate substrate 116 to satisfy both the quality of chips that are needed and the pitches that are needed for optimal bonding productivity/throughput. FIG. 5 shows a schematic top view of the intermediate substrate 116 after a plurality of chips 158 have been placed on the intermediate substrate by the chip placement device 118 following the generated instructions from step S202. As shown in FIG. 5, the plurality of chips 158 are placed in a particular arrangement on the intermediate substrate 116 according to/in accordance with the generated instructions. The plurality of chips 158 are particularly placed on the intermediate substrate 116, with the proper pitches, and the proper quality, so that all of the bonding heads can be used at the same time. FIGS. 6A and 6B show schematic top views of the intermediate substrate 116 to demonstrate how a subset of the plurality of chips 158 can correspond to the plurality of bonding heads 134. As will be discussed below in more detail, the plurality of bonding heads 134 may not actually pick up the chips from the intermediate substrate 116, but the schematic representation shown in FIGS. 6A and 6B illustrate the pitches of the placement on the intermediate substrate 116 as compared to the pitches of the plurality of bonding heads 134. In FIG. 6A the plurality of bonding heads 134 are shown schematically projected onto a first subset of chips on the intermediate substrate 116. As shown in FIG. 6A, when the projected onto the intermediate substrate, each bonding head of the plurality of bonding heads aligns with a chip of the plurality of chips 158. That is, the pitches of the plurality of bonding heads 134 align with a multiple of the pitches of the chips 158. In the case of FIG. 6A, all six example bonding heads line up with six chips. FIG. 6B shows another projection of the plurality of bonding heads 134 onto a second subset of chips of the intermediate substrate 116, where the plurality of bonding heads 134 are shifted over by a single x-dimension pitch $\Delta p_x$. In the case of FIG. 6B, by moving over one x-dimension pitch, all six bonding heads line up with a different set of six chips. Thus, by placing the necessary quality chips onto the intermediate substrate at particular pitches, the chips will be optimally positioned for the efficient bonding process. This concept is shown in more detail below as part of an example bonding process including multiple sets of chips being bonded. While FIGS. 6A and 6B show the bonding head pitch projected onto the pitch of the chips on the intermediate substrate, as explained below, a plurality of transfer heads having the same number of heads and same pitch of the plurality of bonding heads may be used to transfer a set of chips from the intermediate substrate to the plurality of bonding heads.

Figure 7:
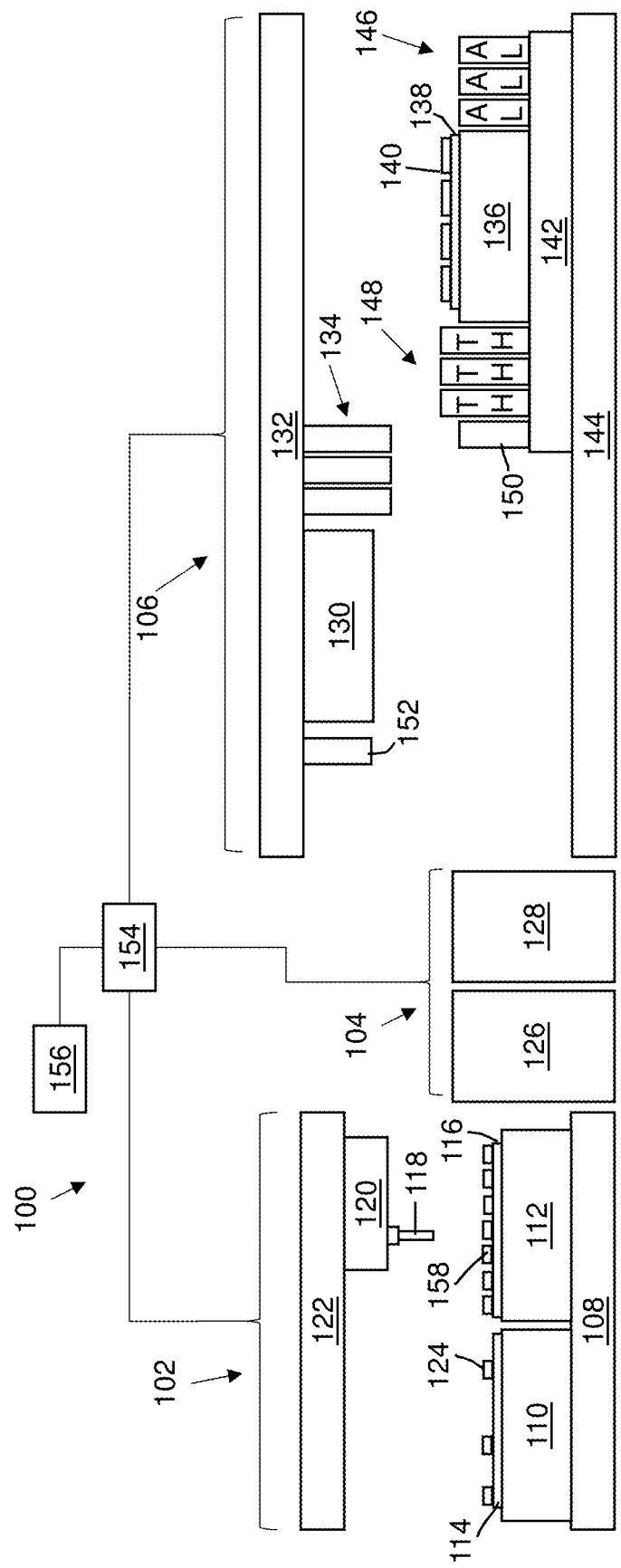
FIG. 7 shows the bonding system of FIG. 1 at a moment after the intermediate substrate has been loaded with the chips that will be used in the bonding process in accordance with an example embodiment.

FIG. 7 shows the bonding system 100 at the moment after the intermediate substrate 116 has been fully loaded with the chips 158 that will be used in the bonding process. As shown in FIG. 6, the source substrate 114 now has less chips because the chips have been placed onto the intermediate substrate 116. As noted above, a plurality of different source substrates may be used in order to fully populate the intermediate substrate 116. Additionally, a plurality of intermediate substrates can be prepared at this stage. In these cases, the transfer robot 126 would bring in and out the source substrates and/or intermediate substrates as necessary.

Figure 8:
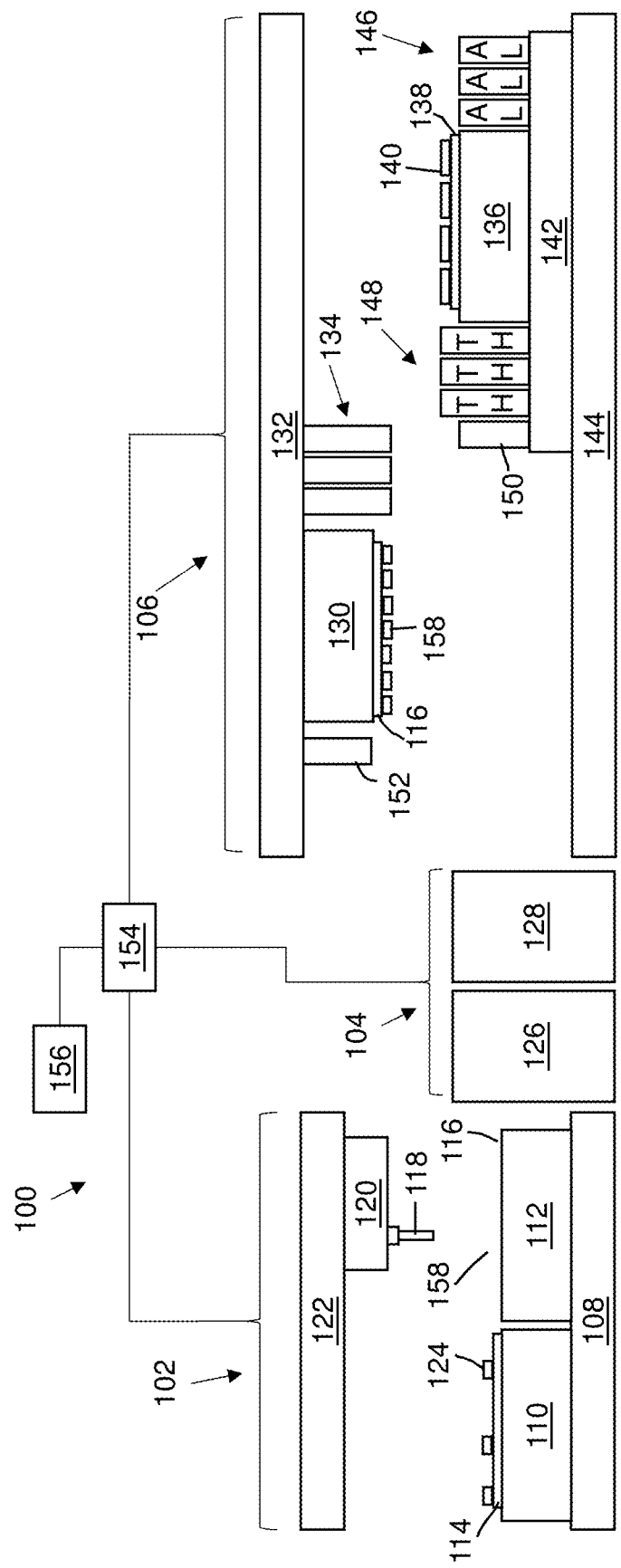
FIG. 8 shows the bonding system of FIG. 1 at a moment when the intermediate substrate is chucked to a second intermediate substrate chuck in accordance with an example embodiment.

Once the intermediate substrate 116 has been populated with chips according to/in accordance with the instructions, the method may proceed to step S206 where the one or more intermediate substrates having the plurality of chips placed thereon is received. That is, the transfer robot 126 will pass the intermediate substrate 116 to the activation device 128 to activate the chips in the manner described above, after which the intermediate substrate 116 is transferred to the chip bonding section 106. After passing through the activation device 128, with the chips activated, the transfer robot 126 will then carry the intermediate substrate 116 to the second intermediate substrate chuck 130 of the chip bonding station 106. The intermediate substrate 116, having the activated chips 158, is then chucked to the second intermediate substrate chuck 130. FIG. 8 shows the bonding system 110 at the moment when the intermediate substrate 116, having the activated chips 158 is chucked to the second intermediate substrate chuck 130. As shown in FIG. 8, in the example embodiment, the chips 158 are facing downward and are adjacent the plurality of bonding heads 134. In an alternative embodiment, the chips on the intermediate substrate are already activated prior to arriving at the chip arranging section 102 and are transferred directly to the bonding section 106 from the chip arranging section 102.

Next, once the intermediate substrate 116 having the activated chips has been mounted to the second intermediate substrate chuck 130, the first microscope 150 may be used to confirm that the plurality of chips 158 are at the proper positions. This step may be performed by moving the carriage 142 along the base 144 until the first microscope 150 is beneath the plurality of chips 158. If the feedback from the first microscope 150 shows that the certain chips of the plurality of chips 158 are outside of an acceptable amount of error, then a replacement intermediate substrate would need to be prepared. If the feedback from the first microscope 150 shows that the plurality of chips 158 are located at the proper positions within an acceptable amount of error, the method may proceed.

The method may then proceed to transferring a first set of chips from the intermediate substrate 116 to the plurality of bonding heads 134. This step may be performed by first moving the carriage 142 along the base 144 until the plurality of transfer heads 148 are beneath the plurality of chips 158. The plurality of transfer heads 148 may include the same number of heads with the same pitches as the plurality of bonding heads 134. The plurality of transfer heads 148 may include a positive integer multiple of the plurality of bonding heads 134. As noted above, this pitch has been set to the same integer multiple of the pitches of the plurality of chips 158 on the intermediate substrate 116. In other words, the plurality of transfer heads 148 are configured to mirror the plurality of bonding heads 134 so that the plurality of transfer heads 148 can transfer up to the same number of chips that the plurality of bonding heads are capable of bonding in a single bonding step. The plurality of transfer heads 148 may pick up the first set of chips 160 from the intermediate substrate 116 by activating a vacuum force, for example. The plurality of transfer heads 148 may maintain the vacuum force while the plurality of transfer heads 148 carrying the first set of chips 160 are moved via the carriage 142 to a position underneath the plurality of bonding heads 134. Either the plurality of transfer heads 148 or the plurality of bonding heads 134 moves toward the other (or both move simultaneously) until the first set of chips 160 are at a position to be transferred to the plurality of bonding heads 134. Once close enough, the vacuum force on the plurality of transfer heads 148 may be terminated and a vacuum force of the plurality of bonding heads 134 may be activated, thereby transferring the first set of chips 160 to the plurality of bonding heads 134.

Figure 9:
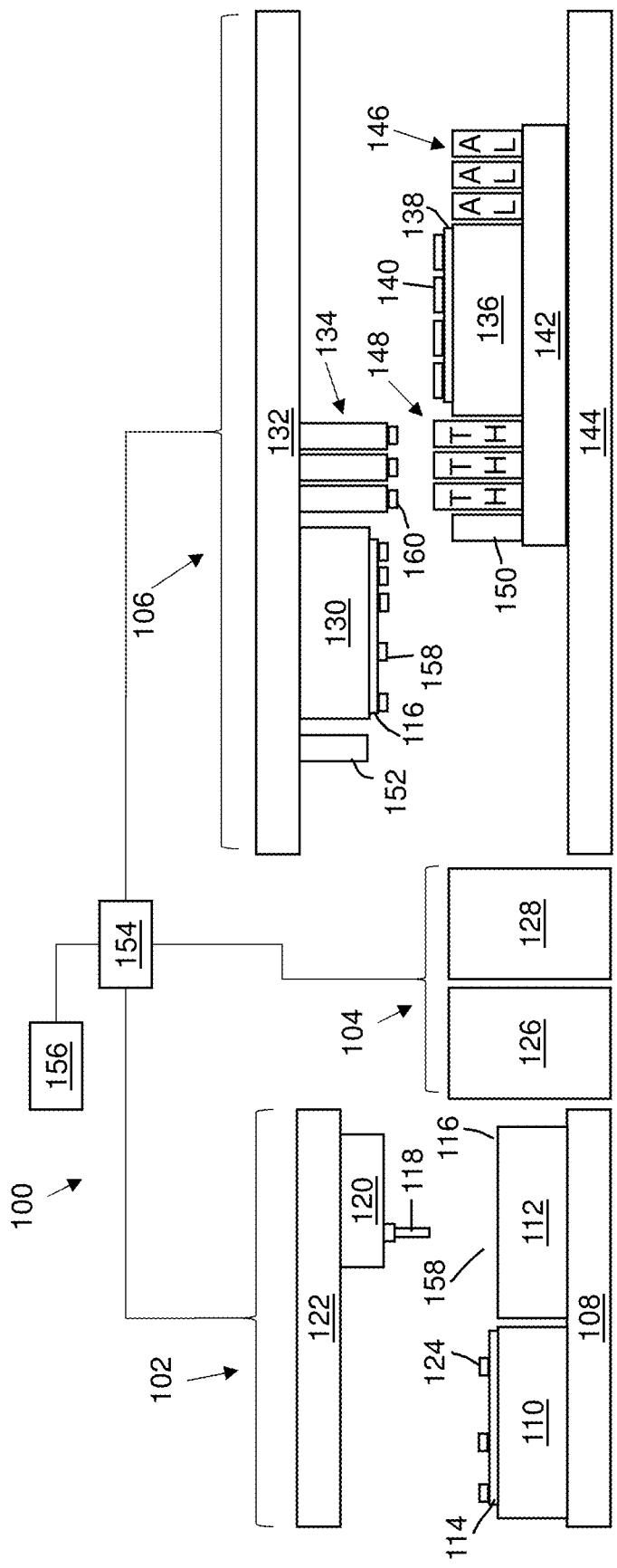
FIG. 9 shows the bonding system of FIG. 1 at a moment after a first set of chips have been transferred from a plurality of transfer heads to the plurality of bonding heads in accordance with an example embodiment.
Figure 10:
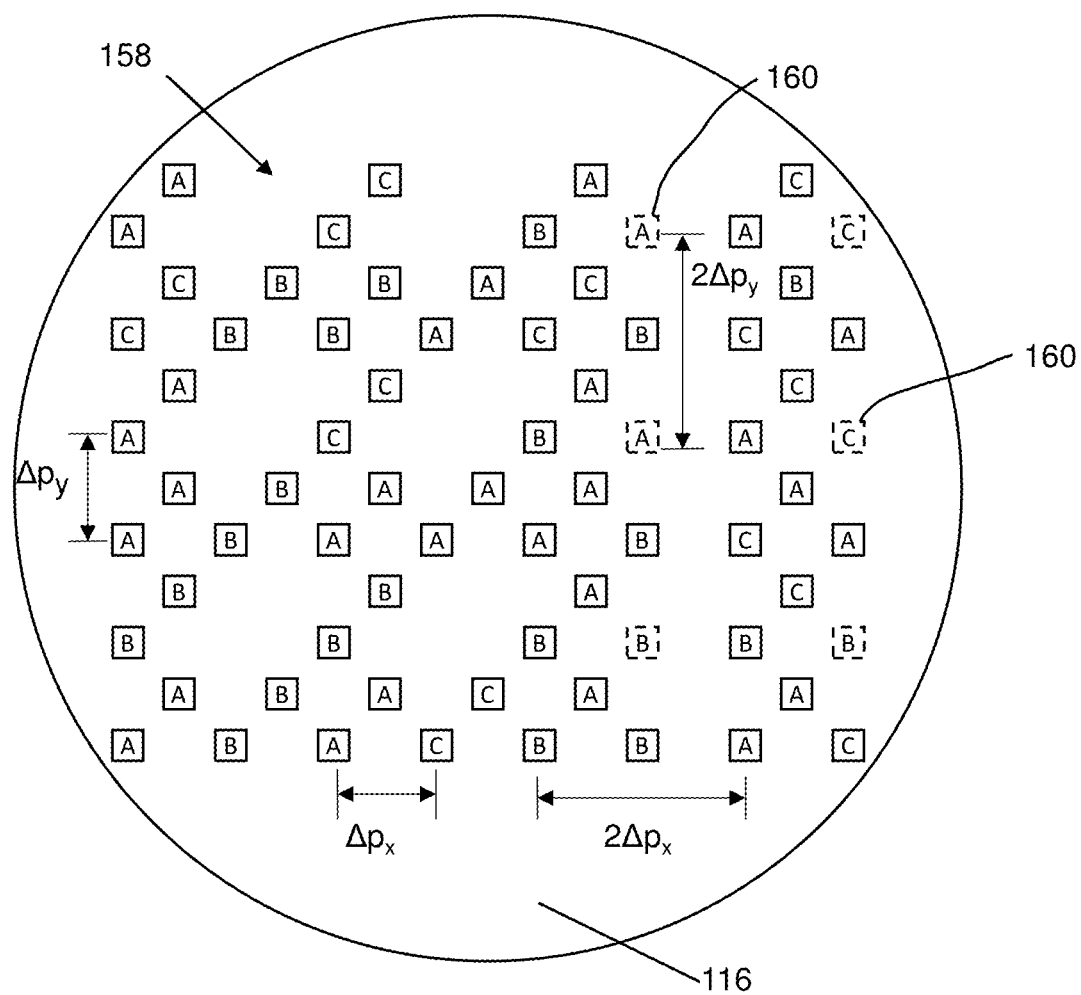
FIG. 10 shows a schematic top view of the intermediate substrate after the first set of chips have been removed in accordance with an example embodiment.

FIG. 9 shows the bonding system 100 at the moment after the first set of chips 160 have been transferred from the plurality of transfer heads 148 to the plurality of bonding heads 134. As shown in FIG. 9, the first set of chips 160 are now carried by the plurality of bonding heads 134 and there are less chips on the intermediate substrate 116. FIG. 10 shows a schematic top view of the intermediate substrate 116 after the first set of chips 160 have been removed. The first set of chips 160 that have been removed are shown in dashed line in FIG. 10 to assist in showing where the first set of chips used to be. That is, the first set of chips 160 shown in dashed line in FIG. 10 are not present on the intermediate substrate at the moment when the first set of chips 160 have been transferred to the plurality of bonding heads 134.

After the first set of chips 160 have been transferred to the plurality of bonding heads 134, the method may proceed to measure and adjust the placement of each individual chip of the first set of chips 160, as necessary, to ensure placement accuracy. This step may be performed by moving the carriage 142 until the plurality of alignment devices 146 are beneath the plurality of bonding heads 134 and beneath the first set of chips 160. The plurality of alignment devices 146 may include a number of alignment devices equal to the number of bonding heads. That is, each alignment unit of the plurality of alignment devices 146 may correspond to one of the bonding heads of the plurality of bonding heads 134. If the set of alignment units is smaller than the set of the bonding heads, the carriage 142 will move the alignment units to the next subset of bonding heads to measure positions of chips. Each alignment unit may be a microscope, a camera, or any sort of measuring device that is capable of measuring the position of each chip on a micron, sub-micron, or nanometer scale. Based on the feedback from each alignment unit, each bonding head, as necessary, can be controlled to move the chip to the precise position. For example, the bonding head may be capable of moving the chip being held in the range of 100 μm, 10 μm, 1 μm, 500 nm, or 50 nm. Thus, by using the information obtained from the plurality of alignment devices 146, the precise position of each individual chip can be acquired.

Once each chip of the first set of chips 160 have been verified to be in the correct position or have been moved to the correct position, the method may proceed to step S208, where the plurality of bonding heads 134 are actuated to collectively bond the first set of chips 160 to the product substrate 138. In particular, each of the chips of the first set of chips 160 is placed onto a product chip of the plurality of product chips 140. Because the quality of the chips and the pitches of the bonding heads were precisely tailored in the manner described above, the plurality of bonding heads 134 are able to bond all of the first set of chips 160 at the same time. In other words, by pre-arranging the plurality of chips 158 on the intermediate substrate 116, taking into account the necessary chip quality and the necessary pitches, the bonding process can be efficiently performed using multiple bonding heads at the same time. As used herein, "collectively" may include providing the bonding instruction to all of the bonding heads at the same moment, may include providing the bonding instruction to all of the bonding heads within 1 second, may include completing the bonding of all of the chips of the set of chips on the bonding heads within 1 to 3 seconds, and may include any amount of time to complete the bonding of all of the chips of the set of chips currently on the bonding heads. That is, whatever amount of time it takes for all of chips of the set of chips currently on the bonding heads be bonded may be considered collective, as long as the transfer head has not yet brought over another set of chips for bonding.

The process of bonding the first set of chips 160 to the product substrate 138 may be performed by first moving the carriage 142 carrying the product substrate chuck 136 until the plurality of bonding heads 134 holding the first set of chips 160 are properly positioned above the corresponding plurality of chips 140 of product substrate 138. Next, either the plurality of bonding heads 134 or product substrate chuck 136 (or both move simultaneously) move toward each other until the first set of chips 160 are at a position to be bonded to the plurality of product chips 140 on the product substrate 138. The bonding occurs by actuating each bonding head of the plurality of bonding heads 134 to bring each chip of the first set of chips 160 into contact with the a corresponding chip of the plurality of product chips 140. Each bonding head may also apply force to the chip to ensure that the chip both conforms and bonds to a corresponding product chip on the product substrate 138. Because the chips have been activated as described above, when the first set of chips 160 is in contact with the product chips 140, hybrid bonding process starts.

Figure 11:
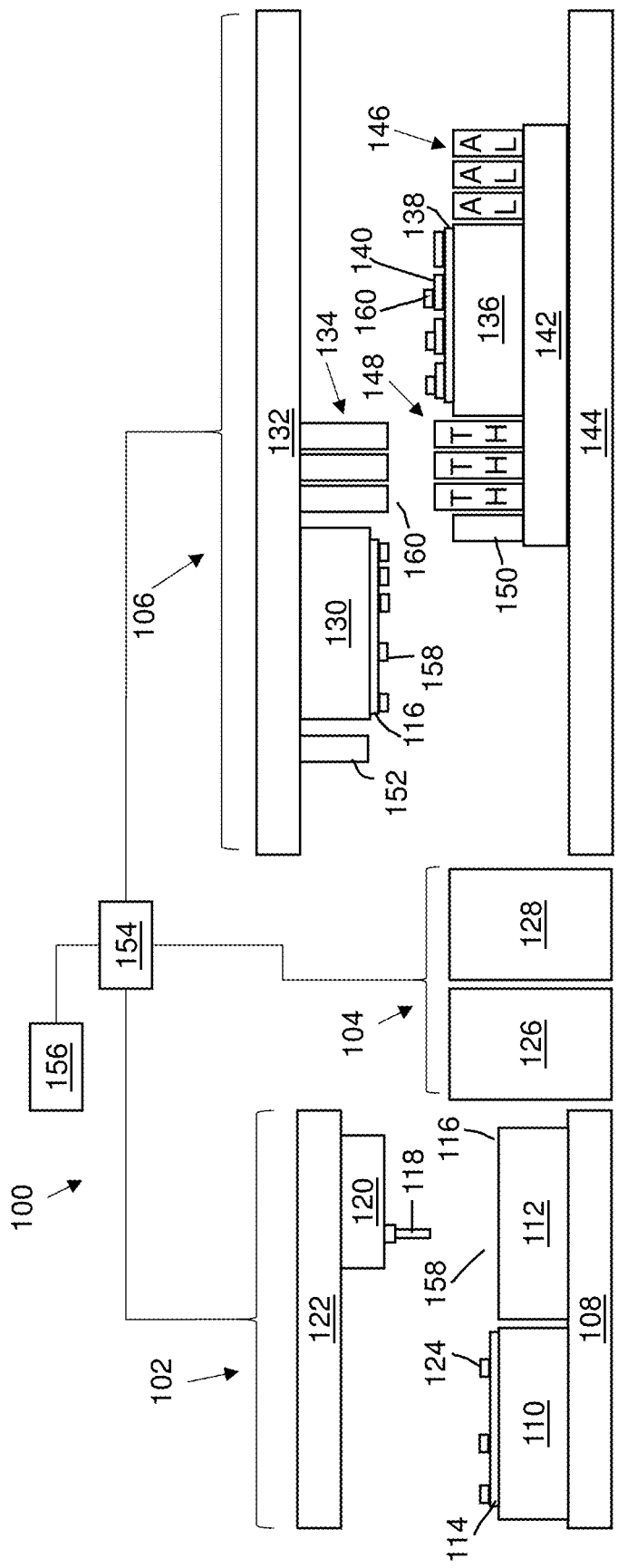
FIG. 11 shows the bonding system of FIG. 1 at a moment after the first set of chips have been bonded to the product chips in accordance with an example embodiment.
Figure 12:
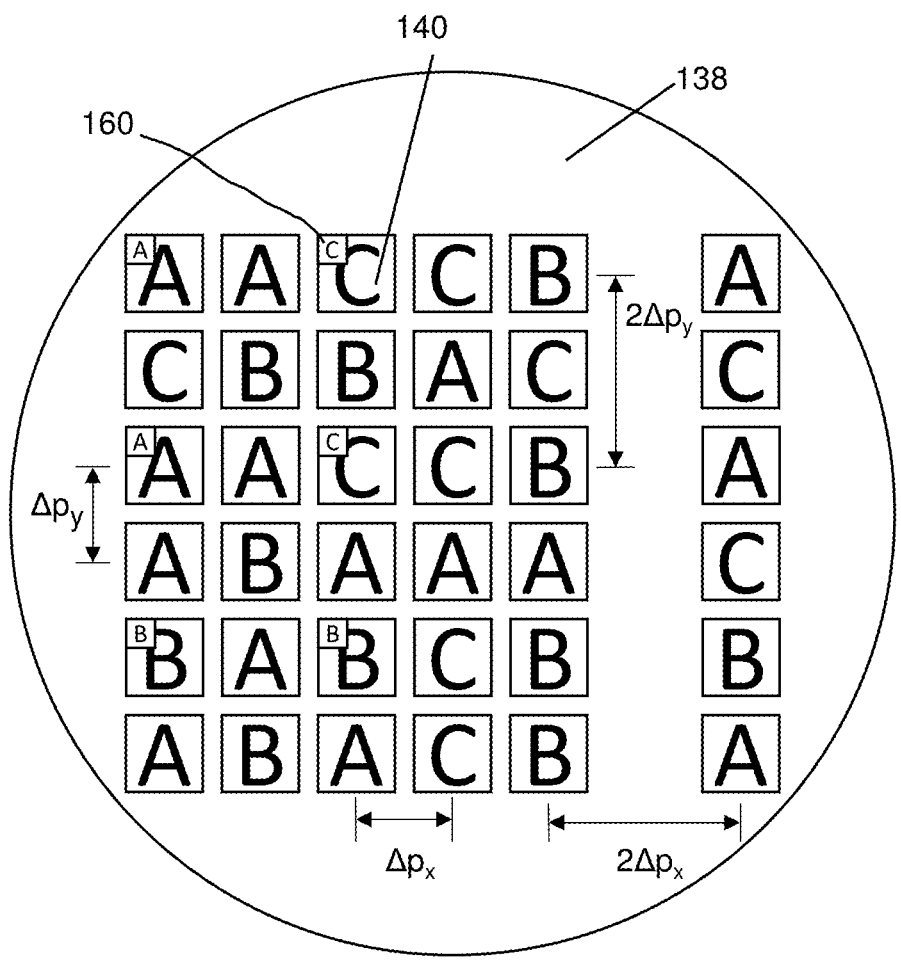
FIG. 12 shows a schematic top view of the product substrate after the first set of chips have been bonded to the product chips in accordance with an example embodiment.

FIG. 11 shows the bonding system 100 at the moment after the first set of chips 160 have been bonded to the product chips 140. As shown in FIG. 11, the first set of chips 160 are no longer on the plurality of bonding heads and are instead located on the plurality of product chips 140. FIG. 12 shows a schematic top view of the product substrate 138 after the first set of chips 160 have been bonded to the product chips 140. As shown in FIG. 12, each chip of the first set of chips 160 has been bonded to a corresponding product chip 160. In the example embodiment six chips were bonded collectively to six corresponding product chips using six bonding heads. Notably, as also shown in FIG. 12, the quality of chips from the first set of chips have been placed on product chips having a corresponding quality. In the example embodiment, the "A" quality chips are bonded to "A" quality product chips, "B" quality chips are bonded to "B" quality product chips, and "C" quality chips are bonded to "C" quality product chips. Furthermore, by comparing FIG. 12 to FIG. 10, it can be appreciated that because the chips on the intermediate substrate 116 were particularly placed to have pitches that are integer multiples of the pitches of the product chips 140, the pitches in FIG. 10 align with the pitches of FIG. 12.

The steps described above can then be repeated until all of the product chips 140 have been bonded to a chip from the plurality of chips 158. In the example embodiment, each time the process is repeated six more chips can be bonded because there are six bonding heads. By pre-arranging the chips on the intermediate substrate to match quality, multiple bonding heads are able to be used collectively as compared to known systems where chips are bonded one at a time to match chip quality. Furthermore, because the pre-arrangement of the clips on the intermediate substrate also take into account the pitches, all of the available bonding heads can be used at the same time. These two factors make the bonding process much more efficient than in known systems.

Figure 13:
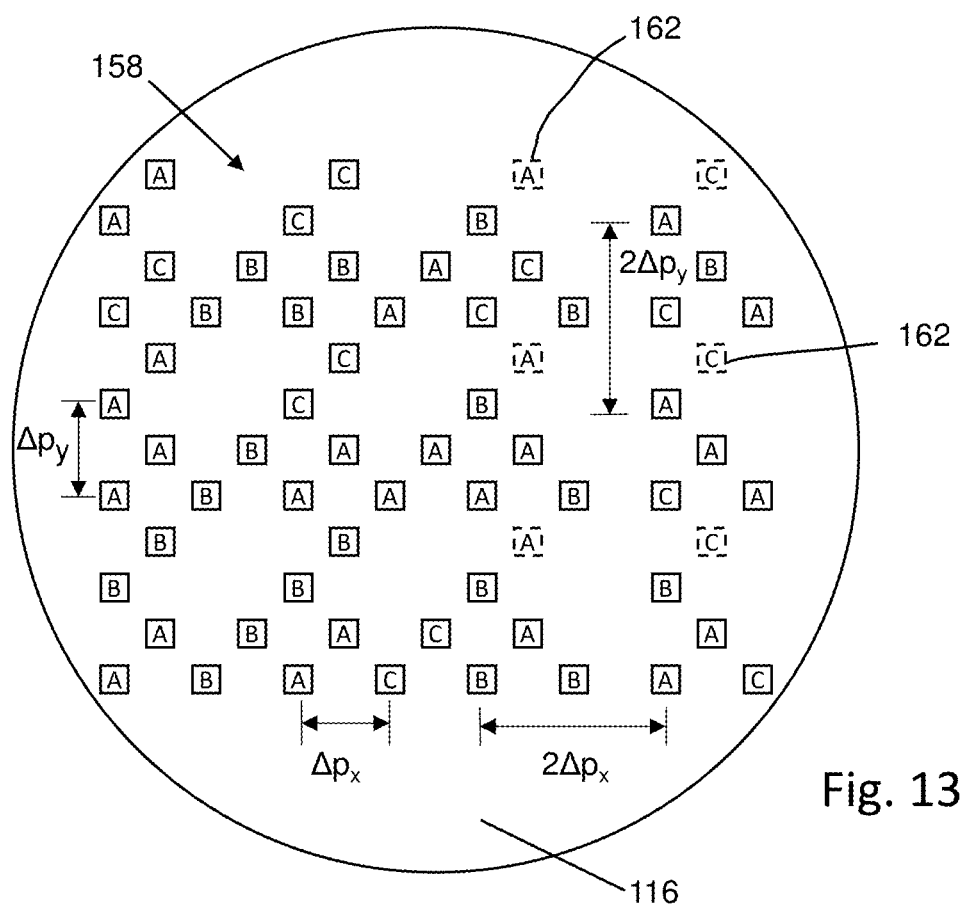
FIG. 13 shows a schematic top view of the intermediate substrate after a second set of chips have been removed in accordance with an example embodiment.
Figure 14:
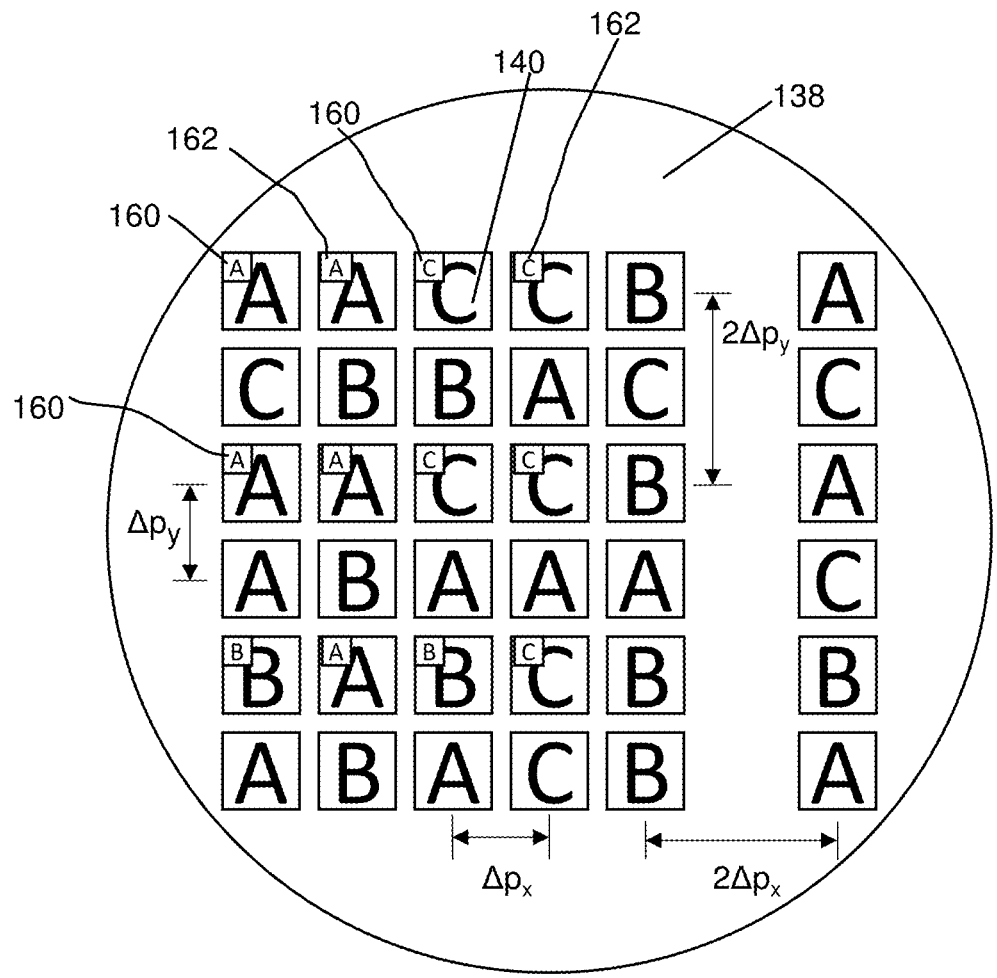
FIG. 14 shows a schematic top view of the product substrate after the second set of chips has been bonded to the product chips in accordance with an example embodiment.

FIG. 13 shows a schematic top view of the intermediate substrate 116 after a second set of chips 162 have been removed. The first set of chips 160 that have been removed are now completely omitted from FIG. 13. The second set of chips 162 are shown in dashed line in FIG. 13 to assist in showing where the second set of chips used to be. That is, the second set of chips 162 shown in dashed line in FIG. 13 are not present on the intermediate substrate at the moment when the second set of chips 162 have been transferred to the plurality of bonding heads 134 and subsequently bonded to the product chips 140 following the same steps discussed above. FIG. 14 shows a schematic top view of the product substrate 138 after the second set of chips 162 has been bonded to the product chips 140. As with the first set of chips 160, each chip of the second set of chips 162 have been bonded to a corresponding product chip 140. In this second bonding step, there are now six more chips bonded to the product chips 140, where all of the chips of the second set of chips 162 are bonded collectively.

Figure 15:
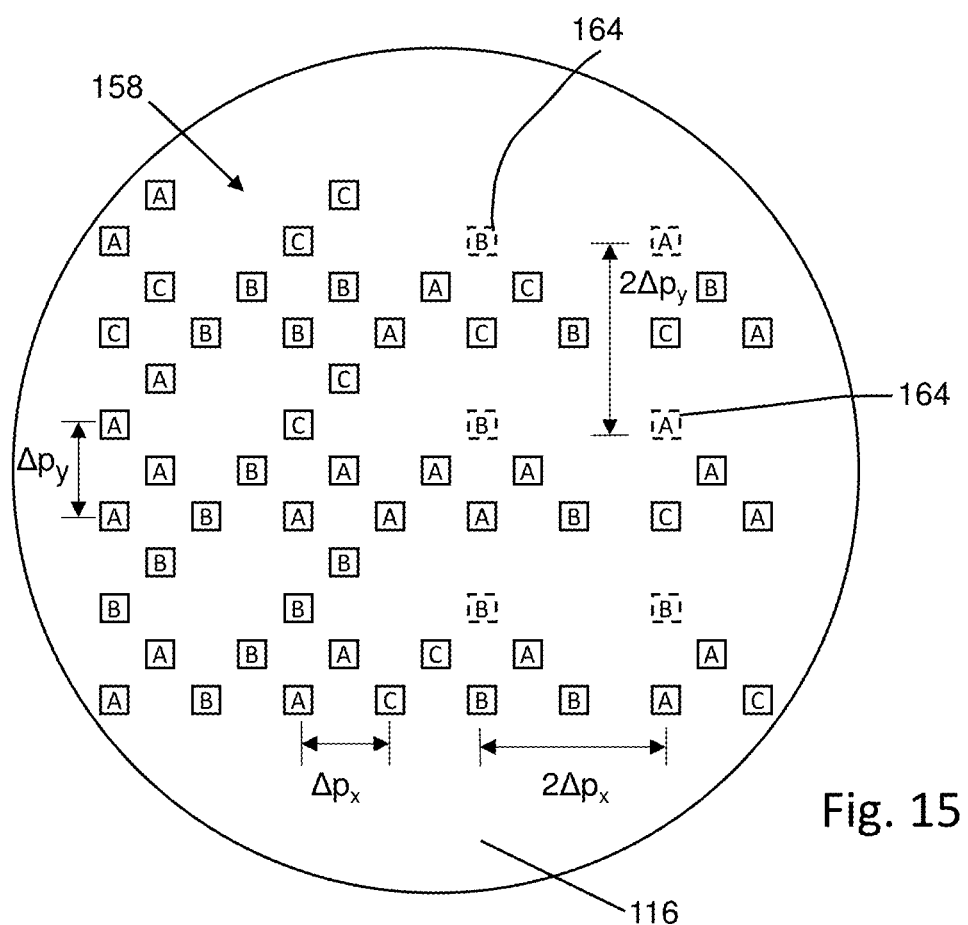
FIG. 15 shows a schematic top view of the intermediate substrate after a third set of chips have been removed in accordance with an example embodiment.
Figure 16:
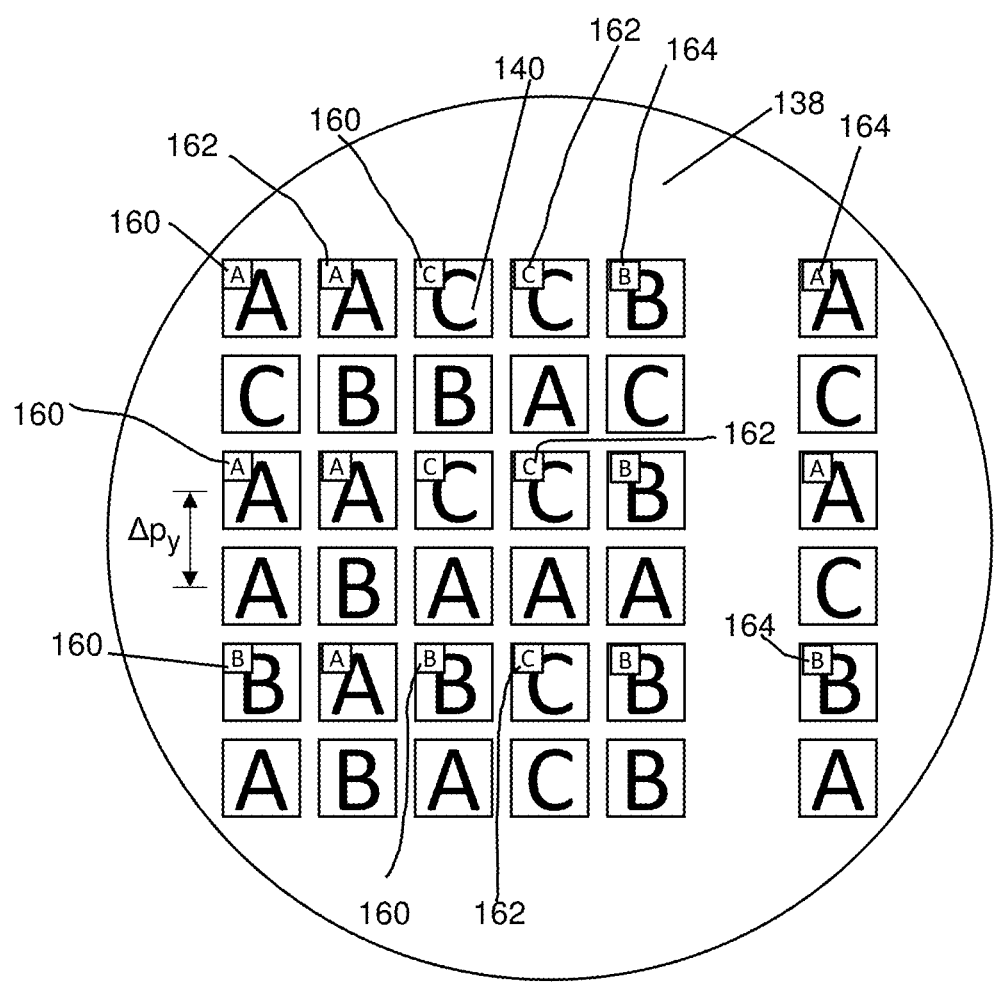
FIG. 16 shows a schematic top view of the product substrate after the third set of chips has been bonded to the product chips in accordance with an example embodiment.

FIG. 15 shows a schematic top view of the intermediate substrate 116 after a third set of chips 164 have been removed. The first set of chips 160 and the second set of chips 162 that have been removed are now completely omitted from FIG. 15. The third set of chips 164 are shown in dashed line in FIG. 15 to assist in showing where the third set of chips used to be. That is, the third set of chips 164 shown in dashed line in FIG. 15 are not present on the intermediate substrate at the moment when the third set of chips 164 have been transferred to the plurality of bonding heads 134 and subsequently bonded to the product chips 140 following the same steps discussed above. FIG. 16 shows a schematic top view of the product substrate 138 after the third set of chips 164 has been bonded to the product chips 140. As with the first set of chips 160 and the second set of chips 162, each chip of the third set of chips 164 has been bonded to a corresponding product chip 140. In this third bonding step, there are now six more chips bonded to the product chips 140, where all of the chips of the third set of chips 164 are bonded collectively.

Figure 17:
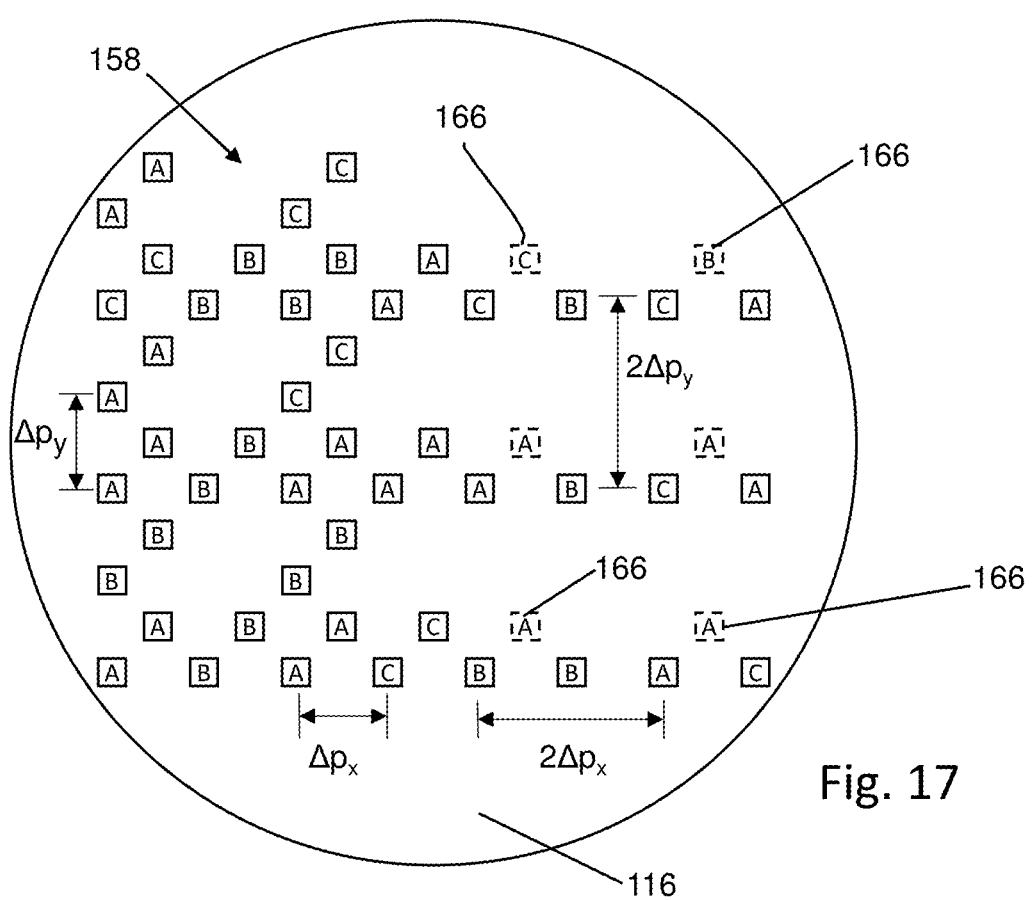
FIG. 17 shows a schematic top view of the intermediate substrate after a fourth set of chips have been removed in accordance with an example embodiment.
Figure 18:
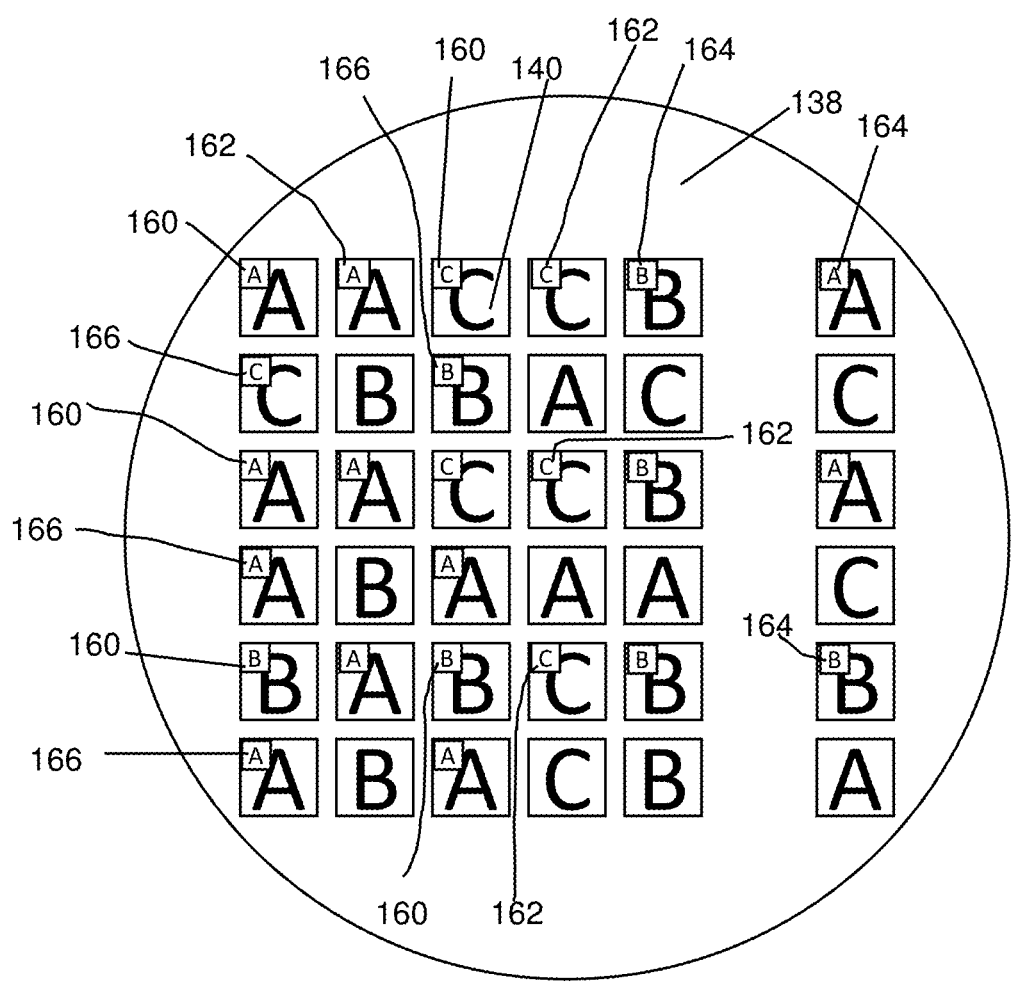
FIG. 18 shows a schematic top view of the product substrate after the fourth set of chips has been bonded to the product chips in accordance with an example embodiment.

FIG. 17 shows a schematic top view of the intermediate substrate 116 after a fourth set of chips 166 have been removed. The first set of chips 160, the second set of chips 162, and the third set of chips 164 that have been previously removed are now completely omitted from FIG. 17. The fourth set of chips 166 are shown in dashed line in FIG. 17 to assist in showing where the fourth set of chips used to be. That is, the fourth set of chips 166 shown in dashed line in FIG. 17 are not present on the intermediate substrate at the moment when the fourth set of chips 166 have been transferred to the plurality of bonding heads 134 and subsequently bonded to the product chips 140 following the same steps discussed above. FIG. 18 shows a schematic top view of the product substrate 138 after the fourth set of chips 166 has been bonded to the product chips 140. As with the first set of chips 160, the second set of chips 162, and the third set of chips 164, each chip of the fourth set of chips 166 has been bonded to a corresponding product chip 140. In this fourth bonding step, there are now six more chips bonded to the product chips 140, where all of the chips of the fourth set of chips 166 are bonded collectively.

Figure 19:
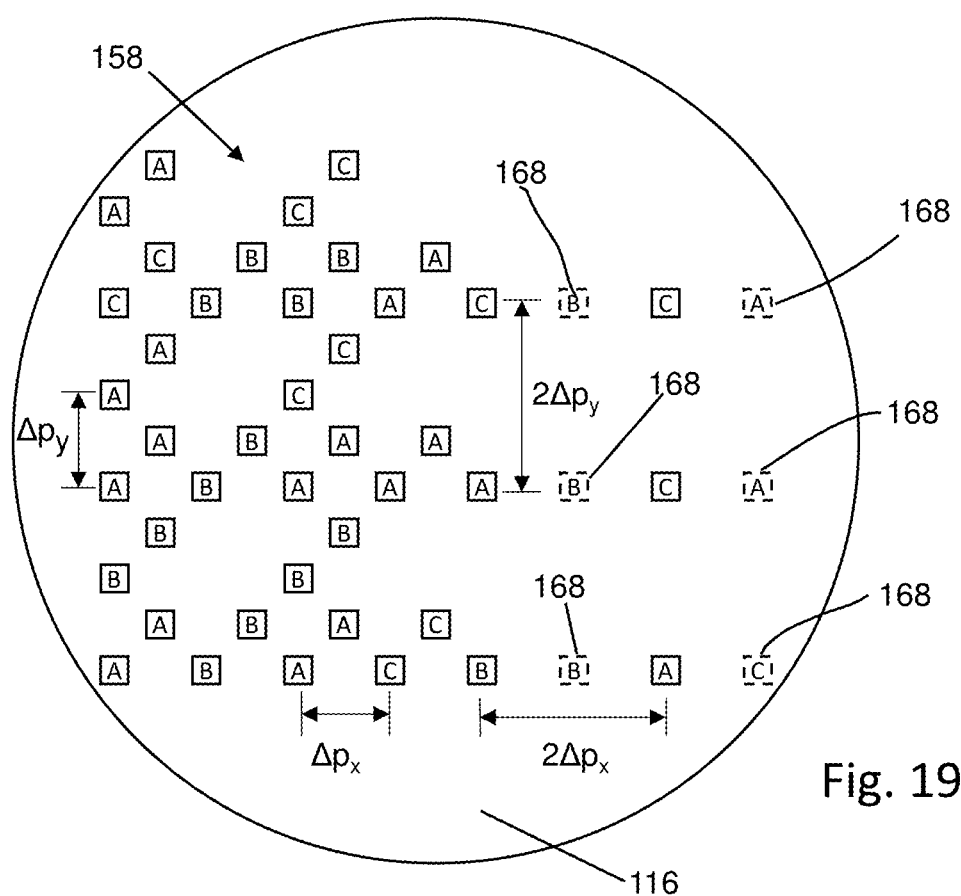
FIG. 19 shows a schematic top view of the intermediate substrate after a fifth set of chips have been removed in accordance with an example embodiment.
Figure 20:
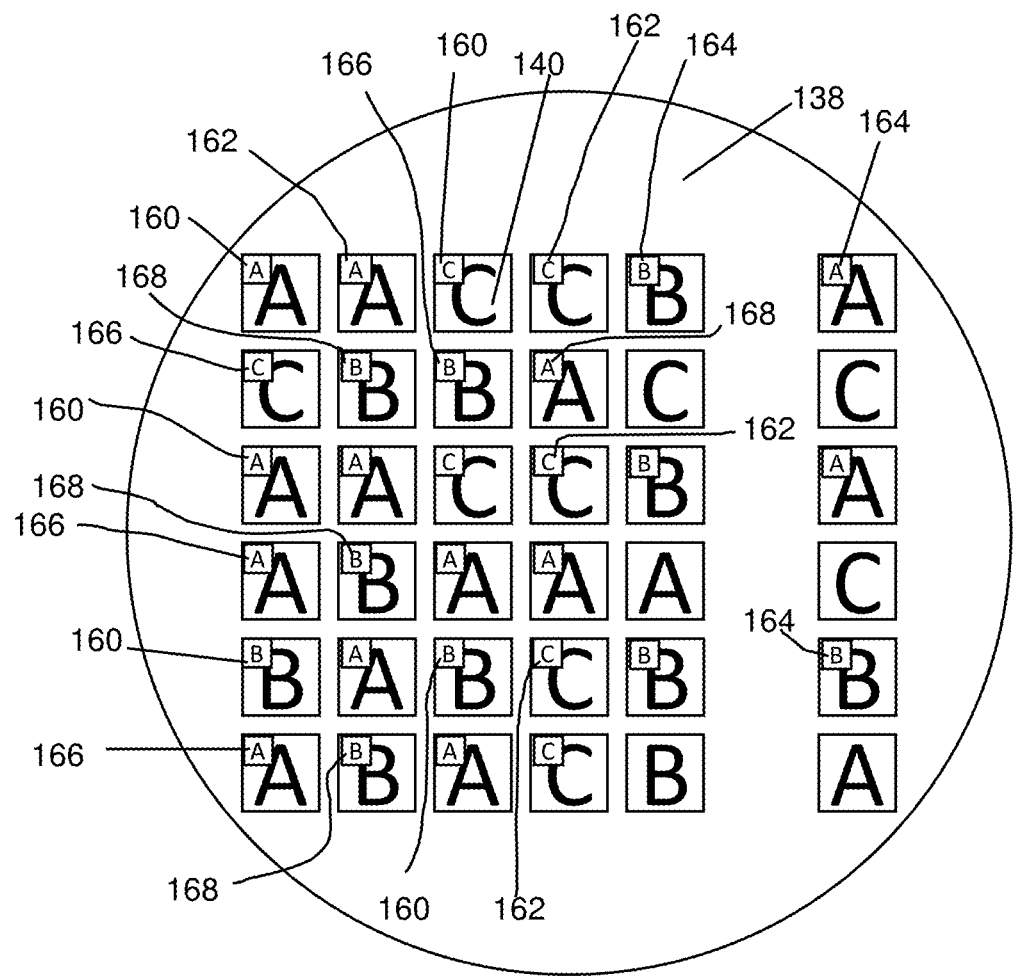
FIG. 20 shows a schematic top view of the product substrate after the fifth set of chips has been bonded to the product chips in accordance with an example embodiment.

FIG. 19 shows a schematic top view of the intermediate substrate 116 after a fifth set of chips 168 have been removed. The first set of chips 160, the second set of chips 162, the third set of chips 164, and the fourth set of chips 166 that have been previously removed are now completely omitted from FIG. 19. The fifth set of chips 168 are shown in dashed line in FIG. 19 to assist in showing where the fifth set of chips used to be. That is, the fifth set of chips 168 shown in dashed line in FIG. 19 are not present on the intermediate substrate at the moment when the fifth set of chips 168 have been transferred to the plurality of bonding heads 134 and subsequently bonded to the product chips 140 following the same steps discussed above. FIG. 20 shows a schematic top view of the product substrate 138 after the fifth set of chips 168 has been bonded to the product chips 140. As with the first set of chips 160, the second set of chips 162, the third set of chips 164, and the fourth set of ships 166, each chip of the fifth set of chips 168 has been bonded to a corresponding product chip 140. In this fifth bonding step, there are now six more chips bonded to the product chips 140, where all of the chips of the fifth set of chips 168 are bonded collectively.

Figure 21:
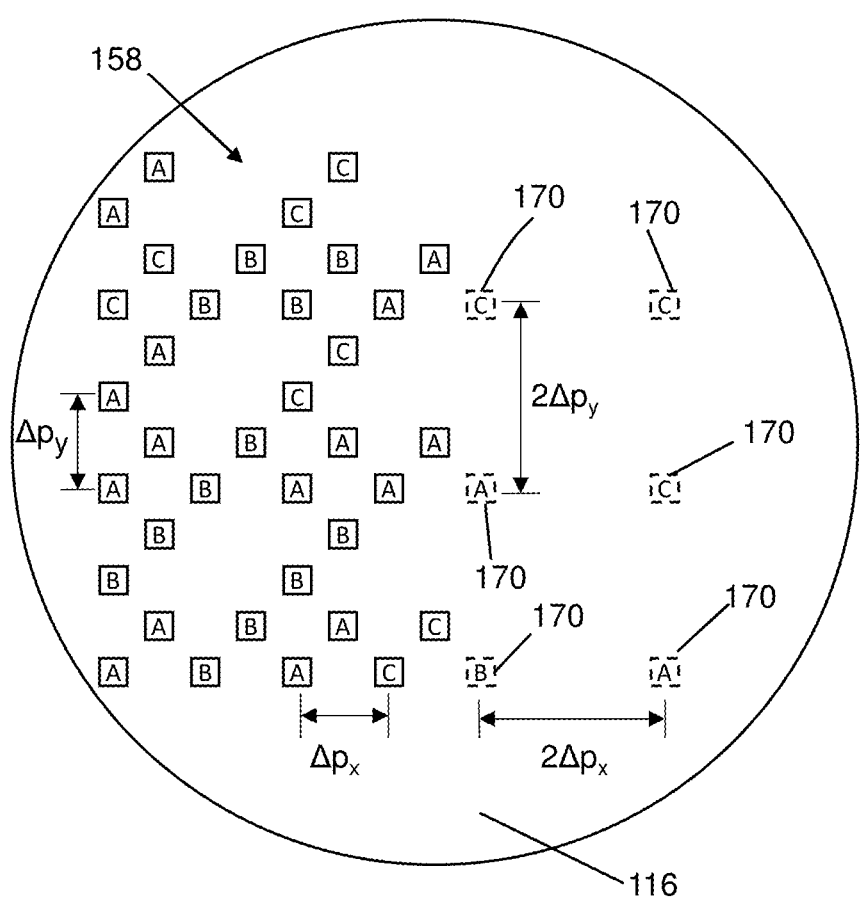
FIG. 21 shows a schematic top view of the intermediate substrate after a sixth set of chips 170 have been removed in accordance with an example embodiment.
Figure 22:
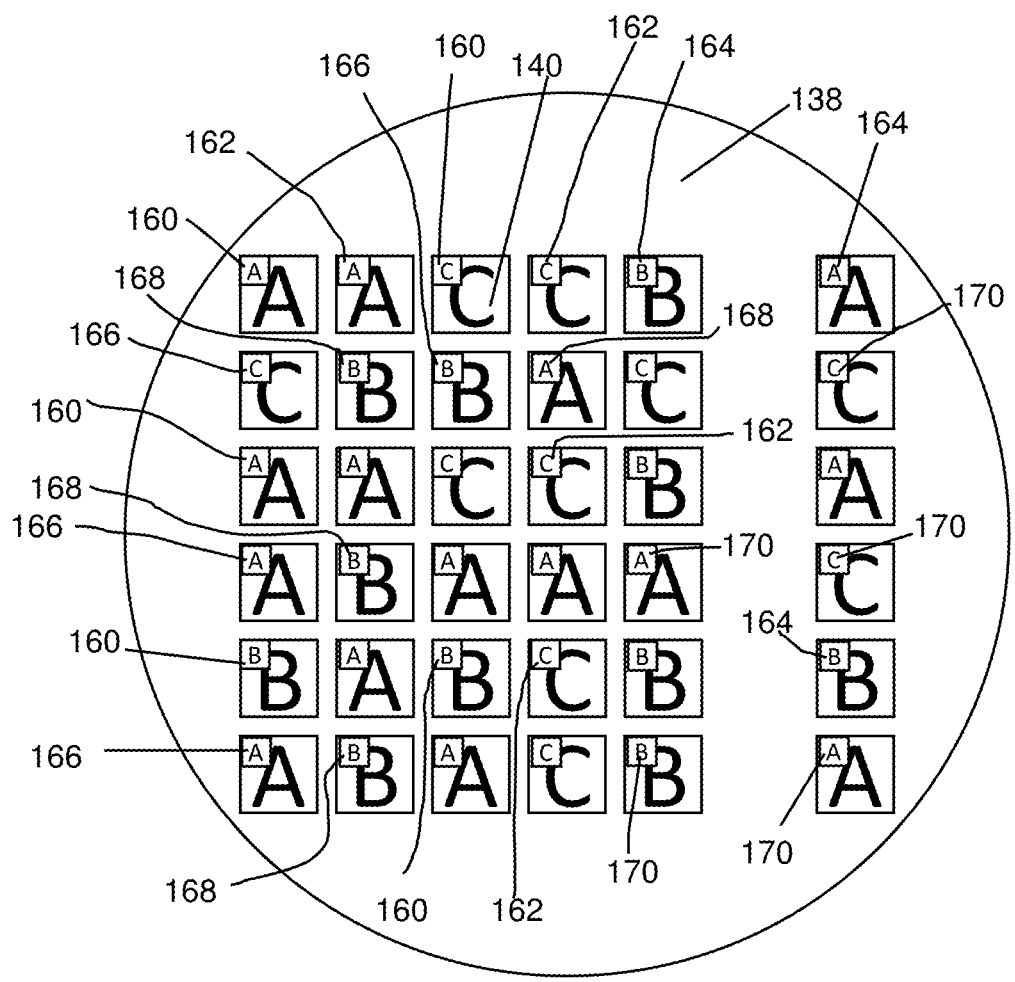
FIG. 22 shows a schematic top view of the product substrate after the sixth set of chips has been bonded to the product chips accordance with an example embodiment.
Figure 23:
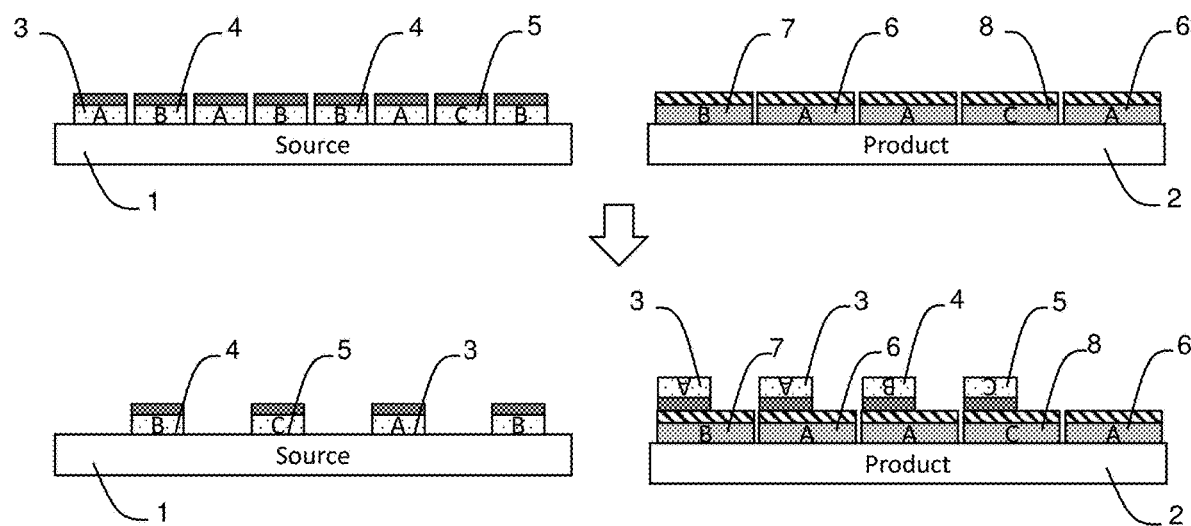
FIG. 23 shows a schematic side view of a related art source substrate and a related art product substrate, in which the multiple bonding heads cannot be used to collectively bond source chips to product chips while matching the quality of the chips.
Figure 24:
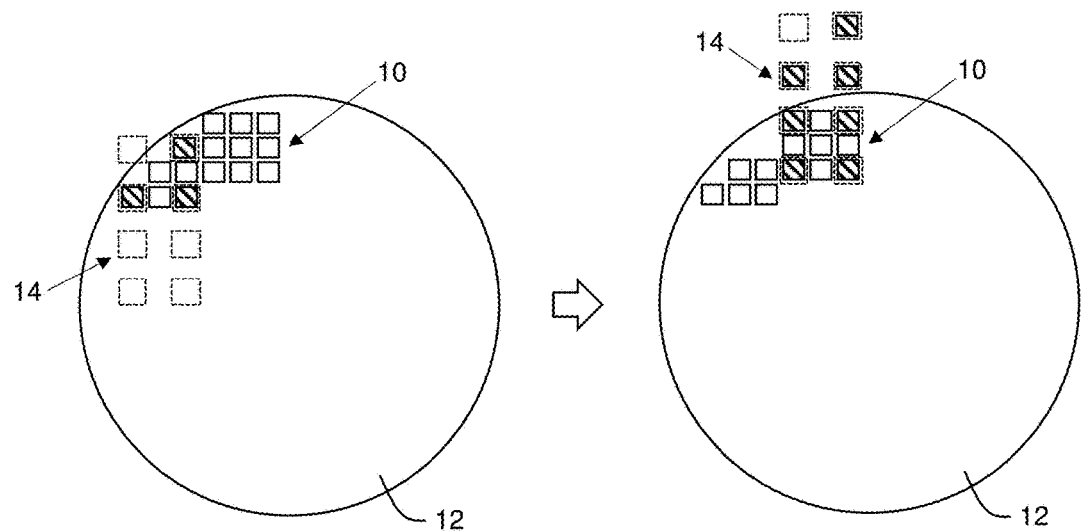
FIG. 24 shows a schematic top view of an example related art source substrate where not all of the available bonding heads can be used during a collective bonding step due to the layout of the source chips on the source substrate.

FIG. 21 shows a schematic top view of the intermediate substrate 116 after a sixth set of chips 170 have been removed. The first set of chips 160, the second set of chips 162, the third set of chips 164, the fourth set of chips 166, and the fifth set of chips 168, that have been previously removed are now completely omitted from FIG. 21. The sixth set of chips 170 are shown in dashed line in FIG. 21 to assist in showing where the sixth set of chips used to be. That is, the sixth set of chips 170 shown in dashed line in FIG. 21 are not present on the intermediate substrate at the moment when the sixth set of chips 170 have been transferred to the plurality of bonding heads 134 and subsequently bonded to the product chips 140 following the same steps discussed above. FIG. 22 shows a schematic top view of the product substrate 138 after the sixth set of chips 170 has been bonded to the product chips 140. As with the first set of chips 160, the second set of chips 162, the third set of chips 164, the fourth set of ships 166, and the fifth set of chips 168 each chip of the sixth set of chips 170 has been bonded to a corresponding product chip 140. In this sixth bonding step, there are now six more chips bonded to the product chips 140, where all of the chips of the sixth set of chips 170 are bonded collectively.

In the illustrated example, after the sixth set of chips 170 have been bonded to the product chips 140, the overall bonding process is complete. That is, all of the product chips now have a source chip bonded to it. Notably, in this example embodiment all six of the bonding heads were able to be used in every bonding step. Similarly, the quality of every source chip matches the quality of the product chip that it was bonded to. Thus, by implementing the method and system disclosed above, including the step of arranging the chips on the intermediate substrate, it is possible to collectively bond multiple source chips to multiple product chips while also matching chip quality and improving productivity/throughput. While the example embodiment allows for all the bonding heads to be implemented in every body step, a source chip arrangement on the intermediate substrate that allows for at least one instance of using all of the available bonding heads is considered an improvement in productivity/throughput as compared to a system where it is not possible to use all of the available bonding heads even a single time. After all of the plurality of chips 140 have chips bonded to them, the product substrate 138 is removed from the chip bonding section 106 by for example the transfer robot 126 or the like. The product substrate may then be subjected to an annealing process (which may include one or both of heat and pressure) in which the hybrid bonding process is completed. The product substrate may be subjected to additional processes in which additional chips are added to the product substrate before or after the annealing process. The product substrate may then be subjected to additional processes, such as: singulation, testing, encapsulation, etc., which are used to produce a plurality of articles from the product substrate.

Note that not all of the activities described above in the general description or the examples are required, that a portion of a specific activity may not be required and that one or more further activities can be performed in addition to those described. Still further, the order in which activities are listed is not necessarily the order in which they are performed. While the above description, was described in the context of hybrid bonding process, other bonding processes may be used such as soldering, flip-chip bonding, ball grid array bonding, or another process that used to form a plurality of electrical connections between chips.

Benefits, other advantages, and solutions to problems have been described above with regard to specific implementations. However, the benefits, advantages, solutions to problems, and any feature(s) that can cause any benefit, advantage, or solution to occur or become more pronounced are not to be construed as a critical, required, or essential feature of any or all the claims.

The specification and illustrations of the implementations described herein are intended to provide a general understanding of the structure of the various implementations. The specification and illustrations are not intended to serve as an exhaustive and comprehensive description of all of the elements and features of apparatus and systems that use the structures or methods described herein. Separate implementations can also be provided in combination in a single implementation, and conversely, various features that are, for brevity, described in the context of a single implementation, can also be provided separately or in any subcombination. Further, reference to values stated in ranges includes each and every value within that range. Many other implementations can be apparent to skilled artisans only after reading this specification. Other implementations can be used and derived from the disclosure, such that a structural substitution, logical substitution, or another change can be made without departing from the scope of the disclosure. Accordingly, the disclosure is to be regarded as illustrative rather than restrictive.

What is claimed is:

1. A method for bonding chips, comprising:
   receiving chip placement information including positions on one or more product substrates where chips are to be bonded;
   generating instructions for a chip placement device to place a plurality of chips from one or more chip sources onto one or more intermediate substrates based on the received chip placement information;
   receiving the one or more intermediate substrates having the plurality of chips placed thereon according to the generated instructions; and
   actuating a plurality of bonding heads to collectively bond a subset of chips of the plurality chips of the one or more intermediate substrates to a product substrate of the one or more product substrates,
   wherein a number of chips of the subset of chips is equal to a number of bonding heads of the plurality of the heads.

2. The method of claim 1, wherein the number of bonding heads is 2 to 16.

3. The method of claim 1, further comprising determining pitch information of the chips that are to be bonded based on the received chip placement information.

4. The method of claim 1, further comprising positioning the plurality of bonding heads based on the received chip placement information.

5. The method of claim 4, wherein positioning the plurality of bonding heads includes positioning the plurality of bonding heads with a pitch that is an integer multiple of the determined pitch information.

6. The method of claim 1, wherein generating the instructions is further based on a pitch of the plurality of bonding heads.

7. The method of claim 6, wherein the instructions include where to place the plurality of chips on the one or more intermediate substrates based on the pitch of the plurality of bonding heads.

8. The method of claim 1, further comprising receiving chip quality information of the chips that are to be bonded.

9. The method of claim 8, wherein generating the instructions is further based on the received chip quality information.

10. The method of claim 8, wherein the instructions include where to place the plurality of chips on the one or more intermediate substrates based on the received chip quality information.

11. The method of claim 1, further comprising transferring the subset of chips from the one or more intermediate substrates to the plurality of bonding heads.

12. The method of claim 11,
    wherein transferring the subset of chips includes using a plurality of transfer heads,
    wherein a number of transfer heads of the plurality of transfer heads is equal to an integer multiple of the number of bonding heads of the plurality of the heads.

13. The method of claim 1, wherein the information includes predetermined accuracy information.

14. The method of claim 13, further comprising adjusting an alignment of the plurality of bonding heads based on the predetermined accuracy information.

15. The method of claim 13, further comprising:
    transferring the subset of chips from the one or more intermediate substrate to the plurality of bonding heads; and
    adjusting an alignment of the first set of chips on the plurality of bonding heads based on the predetermined accuracy information.

16. The method of claim 1, further comprising actuating the plurality of bonding heads to collectively bond a different subset of chips of the plurality chips of the one or more intermediate substrates to the product substrate of the one or more product substrates.

17. The method of claim 1, wherein the plurality of bonding heads bonds the subset of chips to the product substrate by hybrid bonding.

18. The method of claim 1, wherein the subset of chips are from a single intermediate substrate among the one or more intermediate substrates.

19. A system for bonding chips, comprising:
    one or more product substrate chucks configured to hold one or more product substrates;
    one or more intermediate substrate chucks configured to hold one more intermediate substrates;
    a plurality of bonding heads;
    one or more processors; and
    one or more memories storing instructions, when executed by the one or more processors, causing the system to:
    receive chip placement information including positions on the one or more product substrates where chips are to be bonded;
    generate instructions for a chip placement device to place a plurality of chips from one or more chip sources onto the one or more intermediate substrates based on the received chip placement information;
    receive the one or more intermediate substrates having the plurality of chips placed thereon according to the generated instructions, wherein the one more intermediate substrates is held by the one or more intermediate substrate chucks; and actuate the plurality of bonding heads to collectively bond a subset of chips of the plurality chips of the one or more intermediate substrates to a product substrate of the one or more product substrates, wherein the product substrate is held by the one or more product substrate chucks, wherein a number of chips of the subset of chips is equal to a number of bonding heads of the plurality of the heads.

20. A method of manufacturing a plurality of articles, comprising:

receiving chip placement information including positions on one or more product substrates where chips are to be bonded;

generating instructions for a chip placement device to place a plurality of chips from one or more chip sources onto one or more intermediate substrates based on the received chip placement information;

receiving the one or more intermediate substrates having the plurality of chips placed thereon according to the generated instructions;

actuating a plurality of bonding heads to collectively bond a subset of chips of the plurality chips of the one or more intermediate substrates to a product substrate of the one or more product substrates, wherein a number of chips of the subset of chips is equal to a number of bonding heads of the plurality of the heads; and singulating the product substrate to produce the plurality of articles.

* * * * *